US011683984B2

(12) United States Patent
Lee et al.

(10) Patent No.: US 11,683,984 B2
(45) Date of Patent: Jun. 20, 2023

(54) HEAT CONVERSION DEVICE

(71) Applicant: LG INNOTEK CO., LTD., Seoul (KR)

(72) Inventors: Un Hak Lee, Seoul (KR); Jong Hyun Kang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 17/256,120

(22) PCT Filed: Jul. 4, 2019

(86) PCT No.: PCT/KR2019/008239
§ 371 (c)(1),
(2) Date: Dec. 24, 2020

(87) PCT Pub. No.: WO2020/013526
PCT Pub. Date: Jan. 16, 2020

(65) Prior Publication Data
US 2021/0226112 A1     Jul. 22, 2021

(30) Foreign Application Priority Data

Jul. 9, 2018    (KR) .................. 10-2018-0079401
Jul. 12, 2018   (KR) .................. 10-2018-0081162

(51) Int. Cl.
*H10N 10/13*     (2023.01)
*H10N 10/17*     (2023.01)
(Continued)

(52) U.S. Cl.
CPC .............. *H01L 35/30* (2013.01); *H01L 35/16* (2013.01); *H01L 35/32* (2013.01)

(58) Field of Classification Search
CPC .......... H01L 35/16; H01L 35/30; H01L 35/32
See application file for complete search history.

(56) References Cited

U.S. PATENT DOCUMENTS 3,247,578 A * 4/1966 Jaremus .................. H01L 35/08
                                                     228/180.1
5,092,129 A * 3/1992 Bayes ..................... B64G 6/00
                                                     62/259.3
(Continued)

FOREIGN PATENT DOCUMENTS

EP          2 506 323        10/2012
KR    10-2010-0066113         6/2010
(Continued)

OTHER PUBLICATIONS

International Search Report dated Oct. 10, 2019 issued in Application No. PCT/KR2019/008239.
(Continued)

*Primary Examiner* — Tamir Ayad
(74) *Attorney, Agent, or Firm* — KED & Associates LLP

(57) ABSTRACT

A heat conversion device according to an embodiment of the present invention comprises: a frame comprising multiple unit modules arranged in a first direction and in a second direction intersecting with the first direction, respectively, and a first cooling water inflow tube and a first cooling water discharge tube formed along the first direction so as to support the multiple unit modules; multiple second cooling water inflow tubes connected to the first cooling water inflow tube and arranged on one side of the multiple unit modules along the second direction; and multiple second cooling water discharge tubes connected to the first cooling water discharge tube and arranged on the other side of the multiple unit modules along the second direction. Each unit module comprises a cooling water passage chamber, a first thermoelectric module arranged on a first surface of the cooling water passage chamber, and a second thermoelectric module arranged on a second surface of the cooling water passage chamber. A cooling water inflow port is formed on a third surface between the first and second surfaces of the cooling water passage chamber. A cooling water discharge port is formed on a fourth surface between the first and second surface of the cooling water passage chamber. The cooling water inflow port is connected to the second cooling water inflow tubes, and the cooling water discharge port is connected to the second cooling water discharge tubes.

18 Claims, 16 Drawing Sheets

(51) Int. Cl.
    *H01L 35/30*      (2006.01)
    *H01L 35/16*      (2006.01)
    *H01L 35/32*      (2006.01)
    *H10N 10/852*    (2023.01)

(56) References Cited

U.S. PATENT DOCUMENTS

| | | |
|---|---|---|
| 2010/0031988 A1 | 2/2010 | Bell |
| 2012/0145215 A1* | 6/2012 | Hwang .............. C23C 16/4488 427/255.6 |
| 2012/0247526 A1 | 10/2012 | Okuda et al. |
| 2017/0018825 A1 | 1/2017 | Grunwald et al. |

FOREIGN PATENT DOCUMENTS

| | | |
|---|---|---|
| KR | 10-0986657 | 10/2010 |
| KR | 10-2013-0096410 A | 8/2013 |
| KR | 10-1435667 | 9/2014 |
| KR | 10-2016-0077619 A | 7/2016 |
| WO | WO 2003/071198 | 8/2003 |

OTHER PUBLICATIONS

European Search Report dated Mar. 4, 2022 issued in EP Application No. 19833888.1.
Korean Office Action dated Jun. 21, 2022 issued in Application 10-2018-0079401.
Korean Office Action dated Aug. 29, 2022 issued in Application 10-2018-0081162.

\* cited by examiner

[FIG. 1]
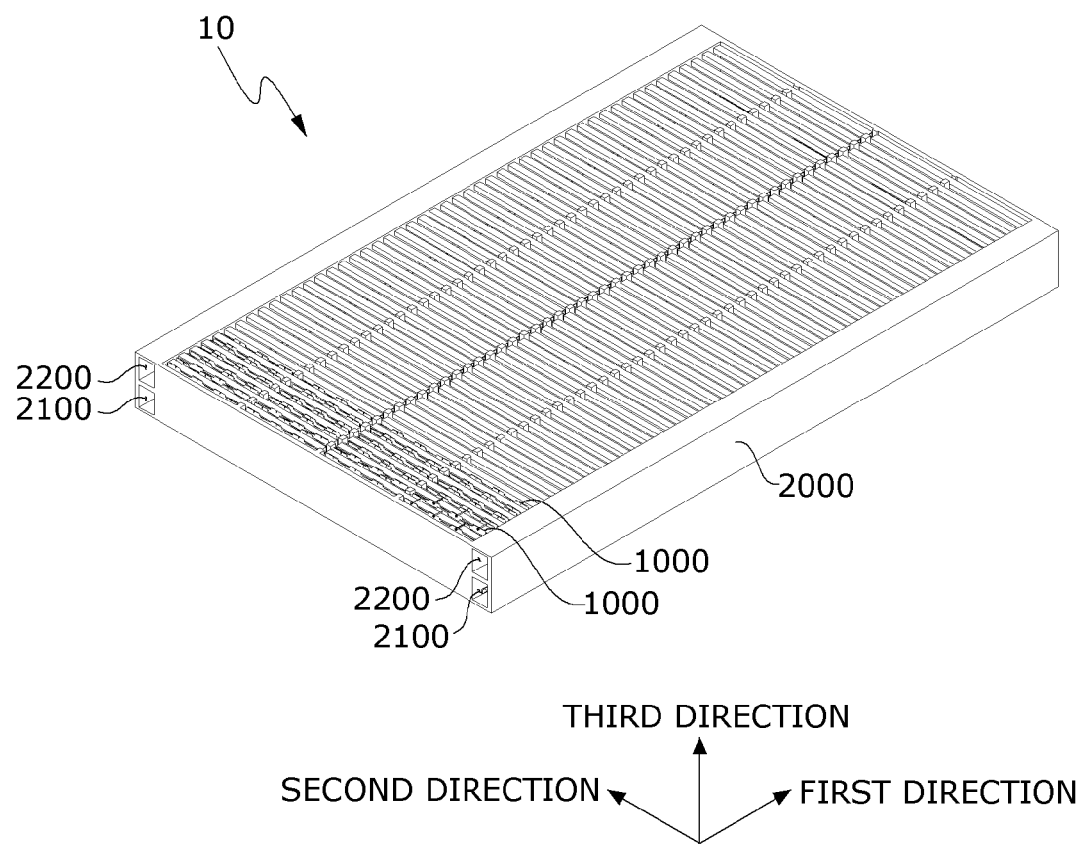

[FIG. 2]
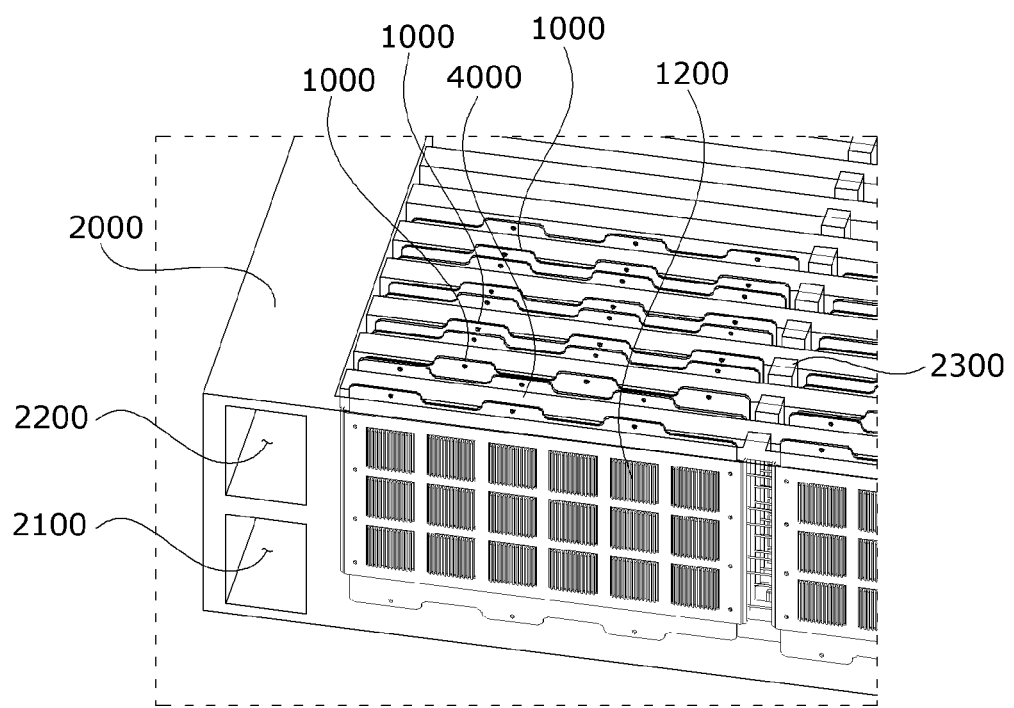
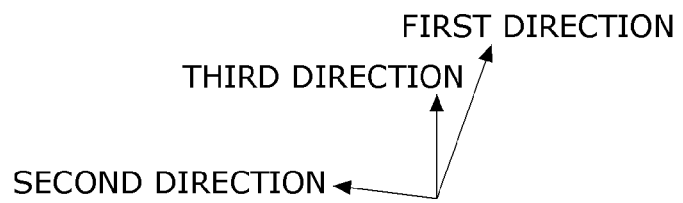

[FIG. 3]
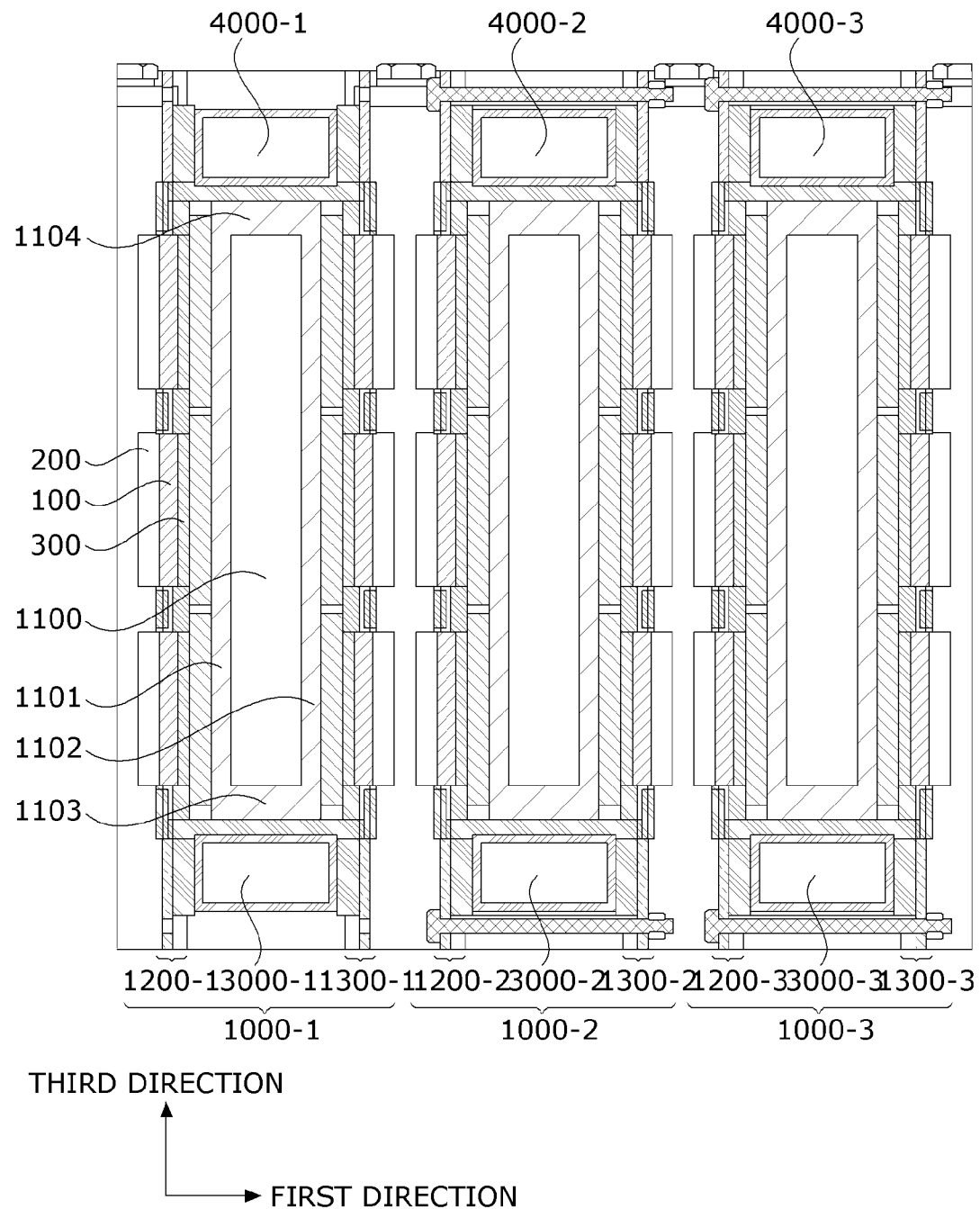

[FIG. 4]
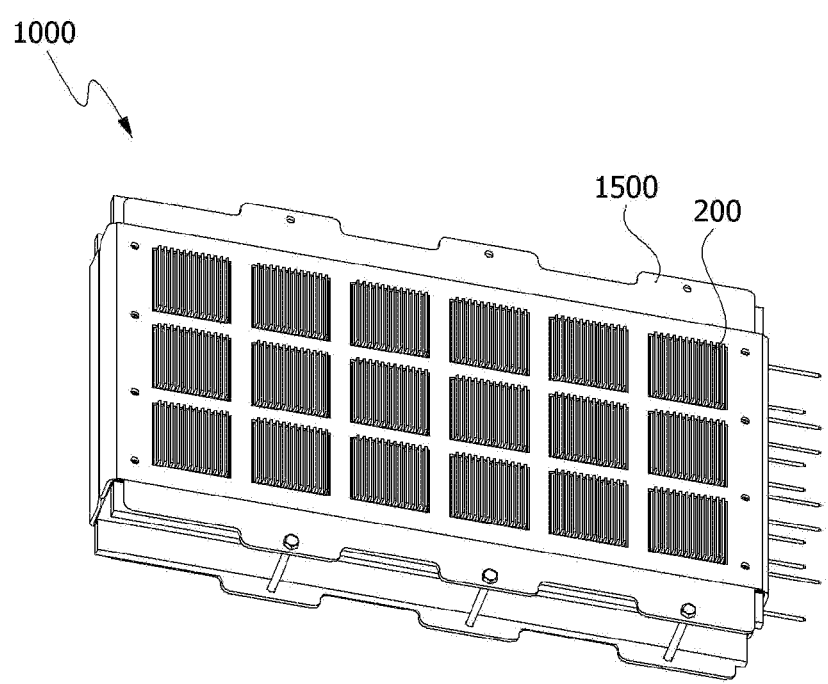

[FIG. 5]
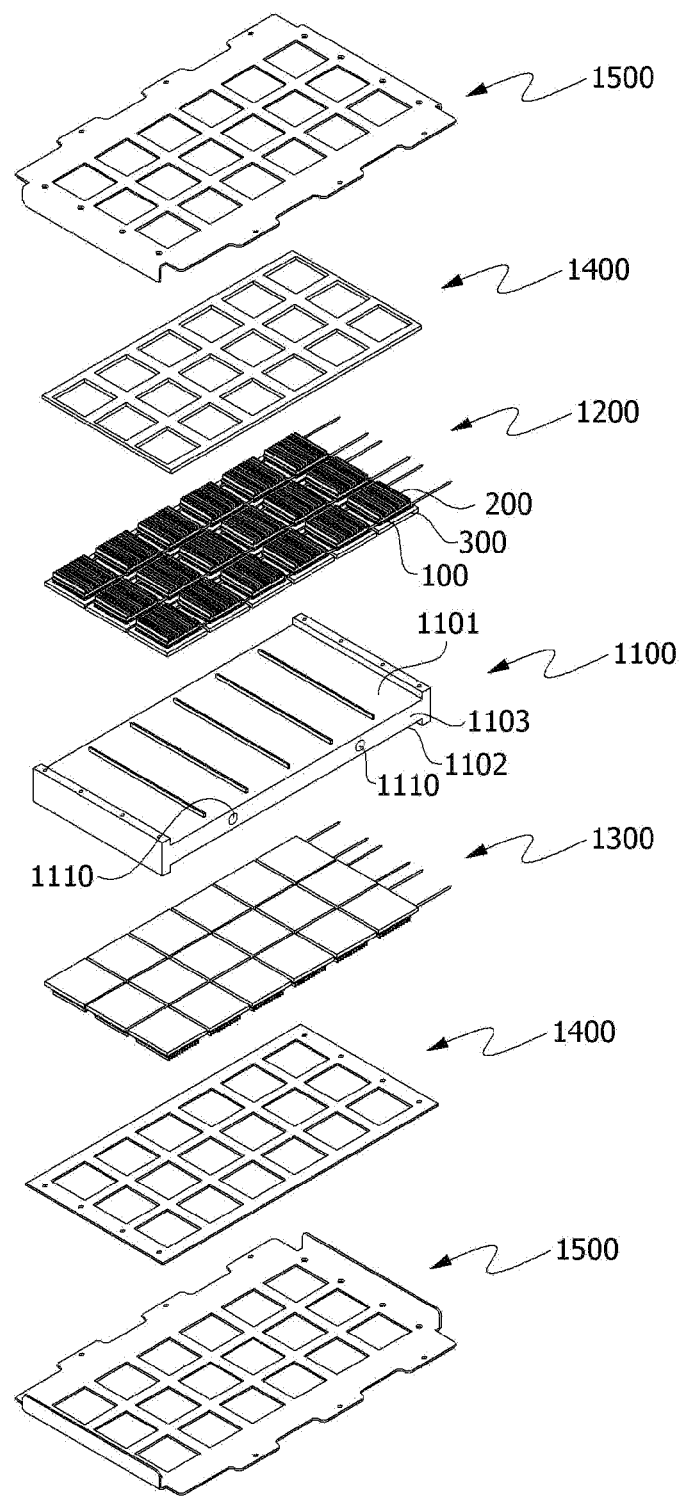

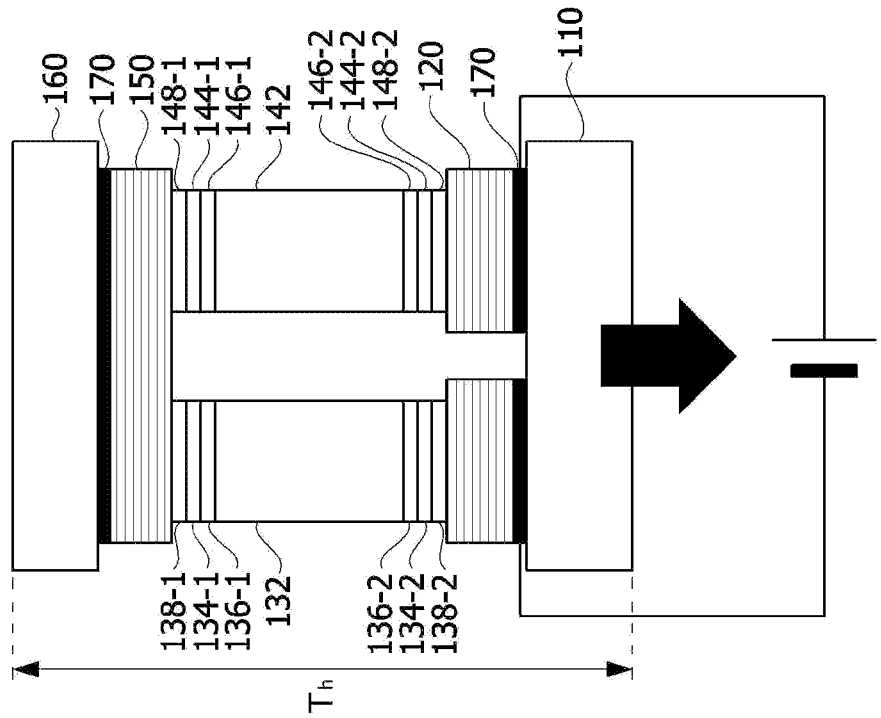
[FIG. 6A]
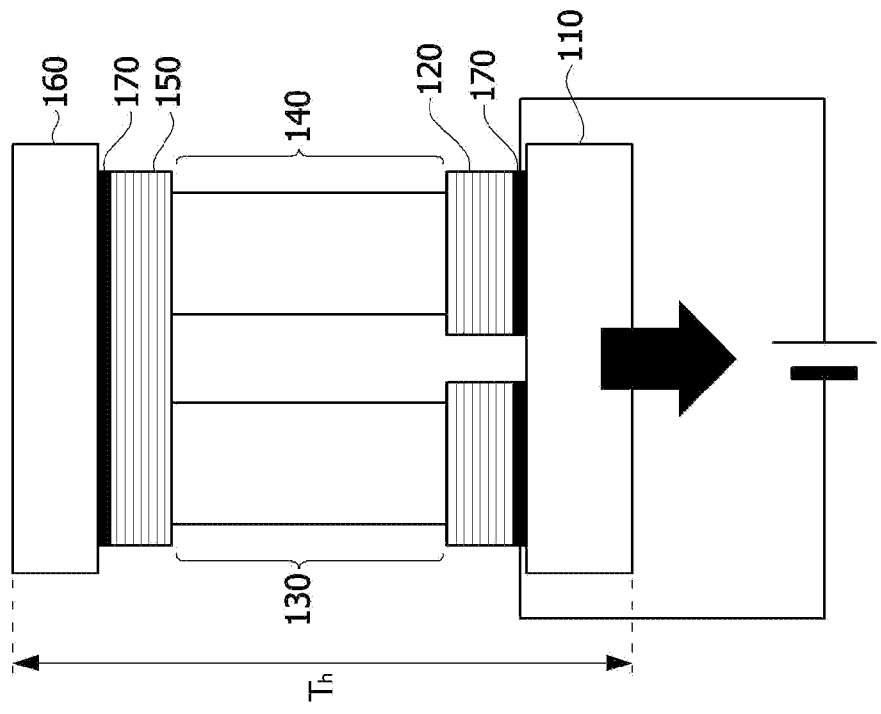
[FIG. 6B]

[FIG. 7]
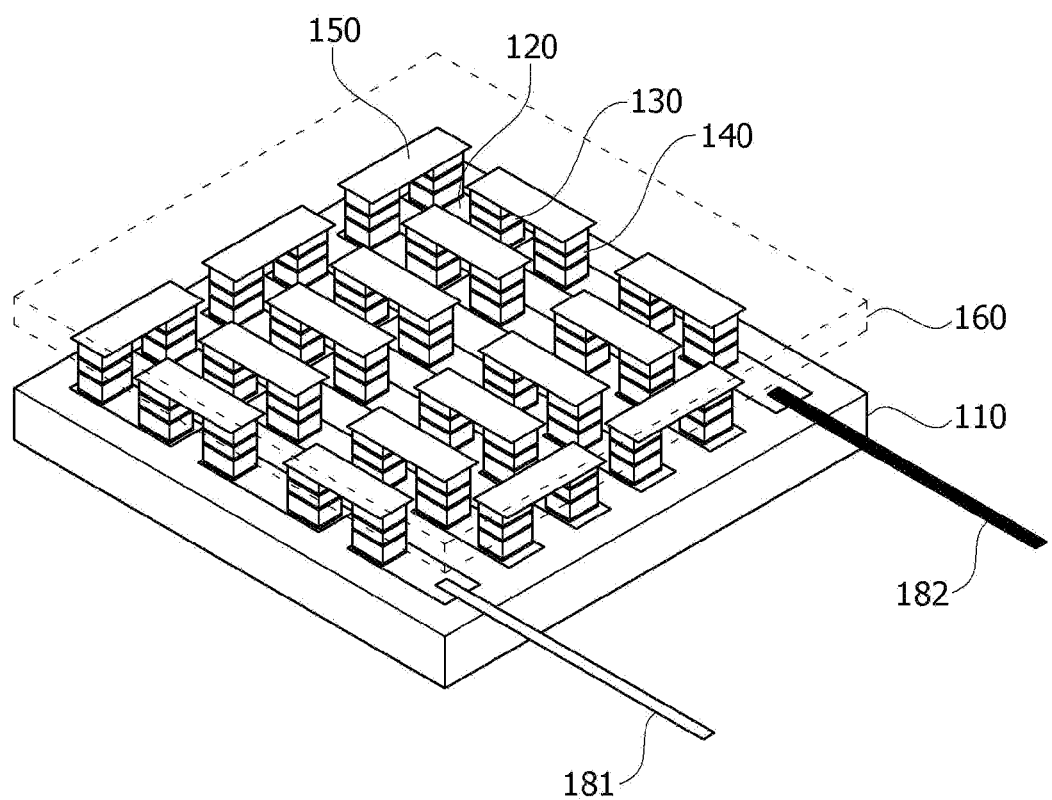

[FIG. 8]
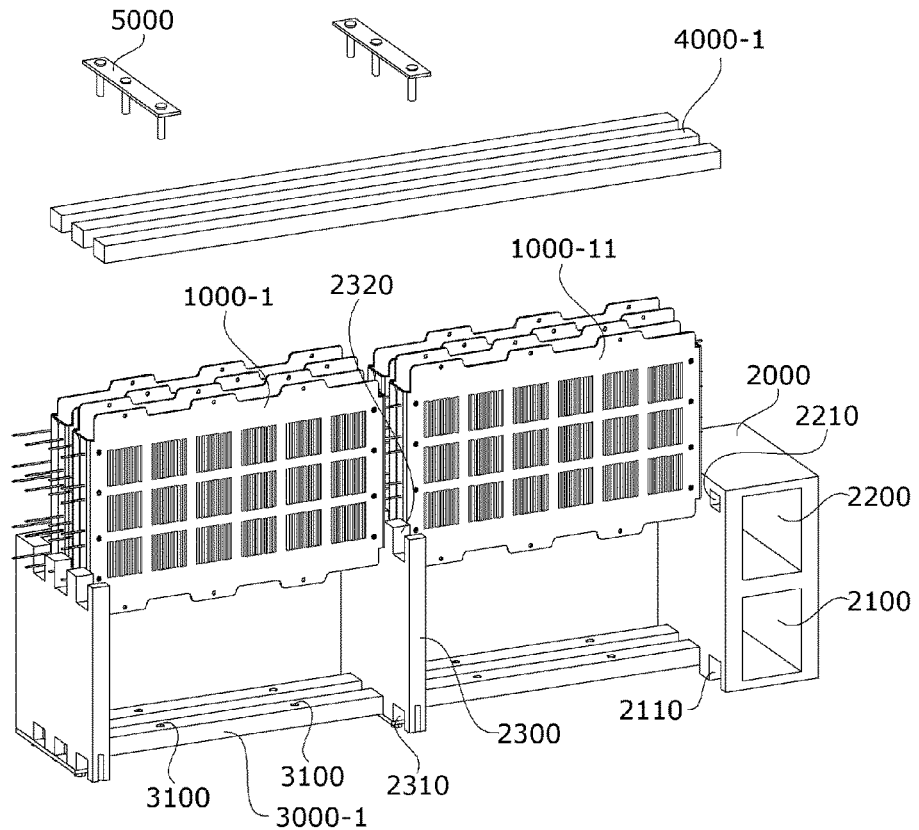
THIRD DIRECTION
FIRST DIRECTION
SECOND DIRECTION
[FIG. 9]
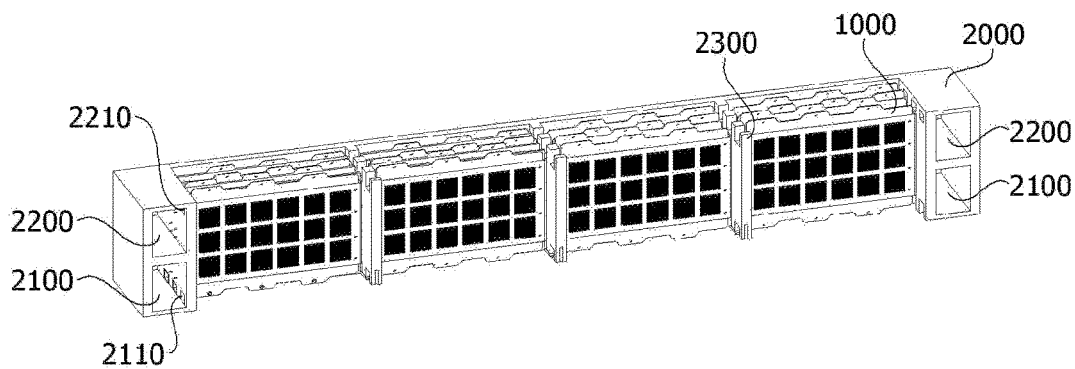

[FIG. 10]
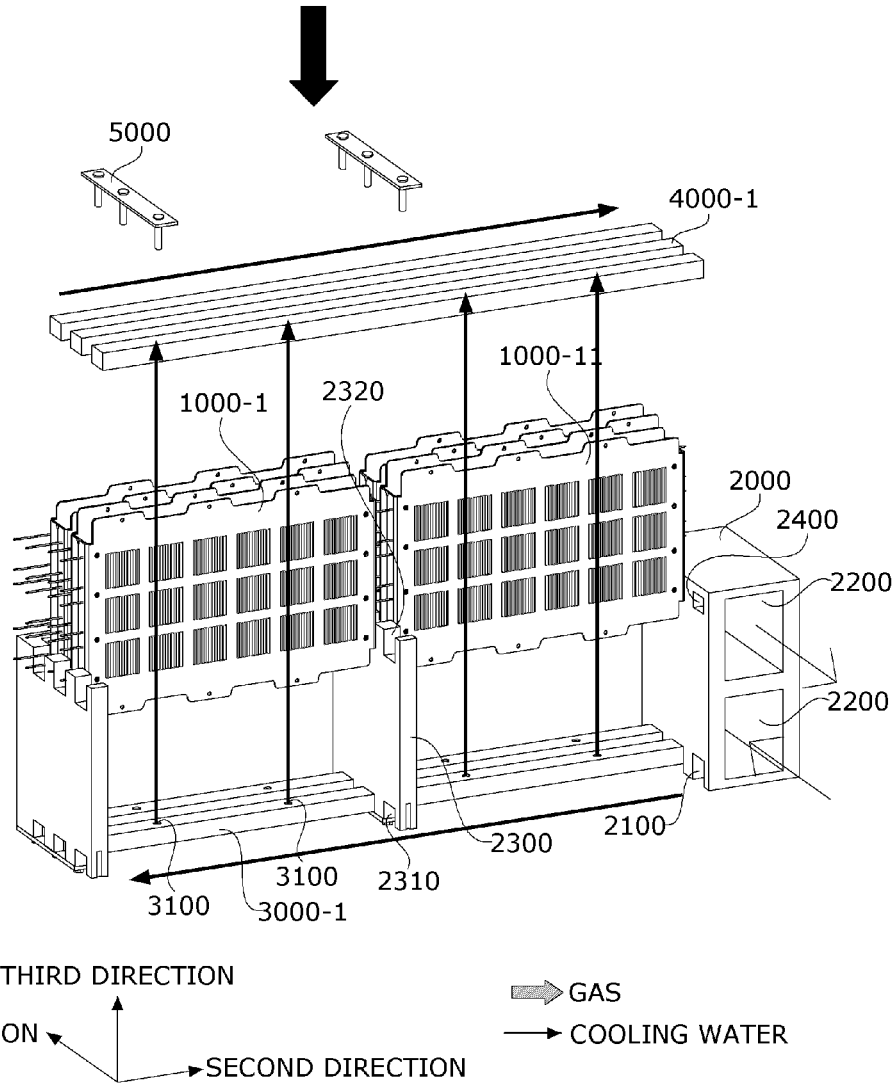
[FIG. 11]
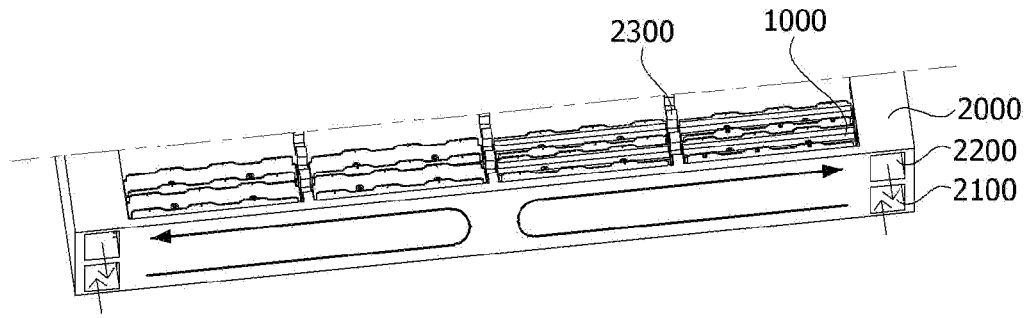

[FIG. 12]
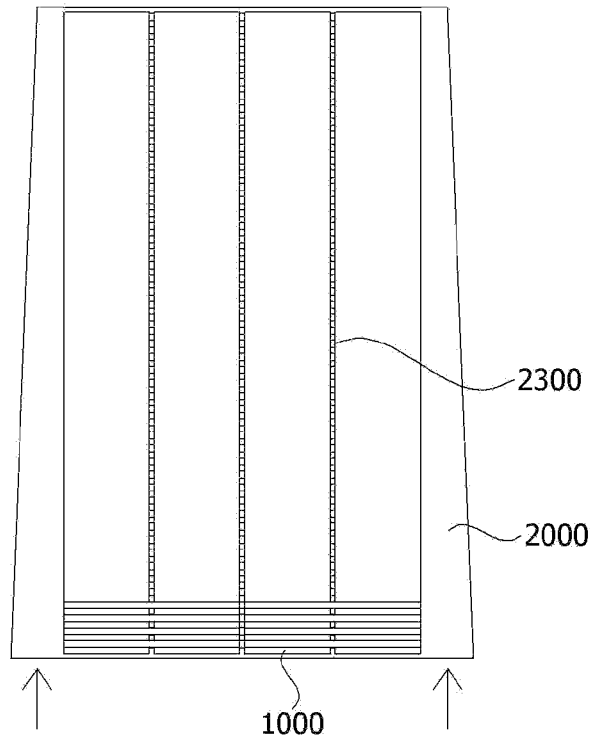
[FIG. 13]
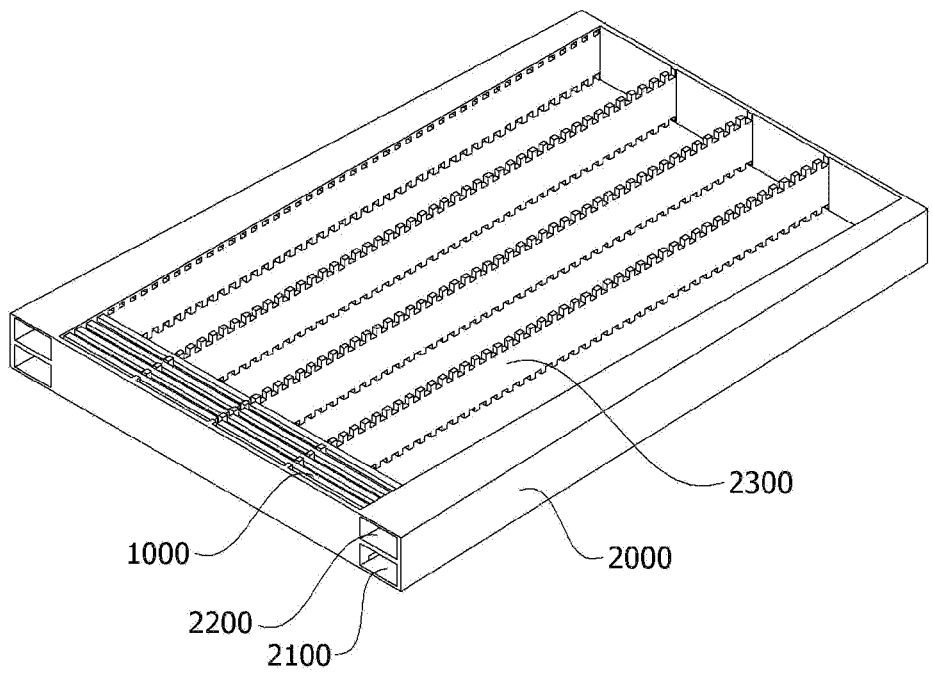

[FIG. 14]
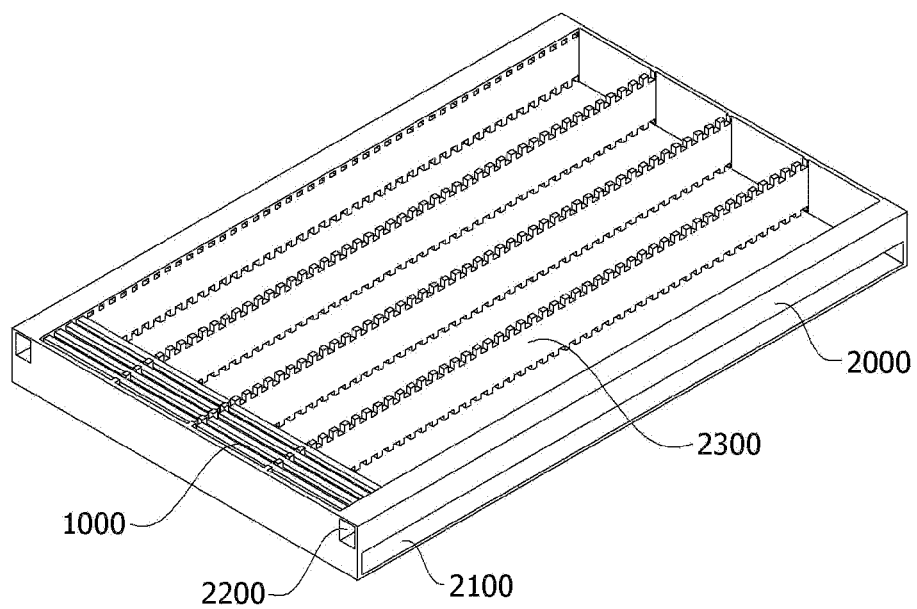

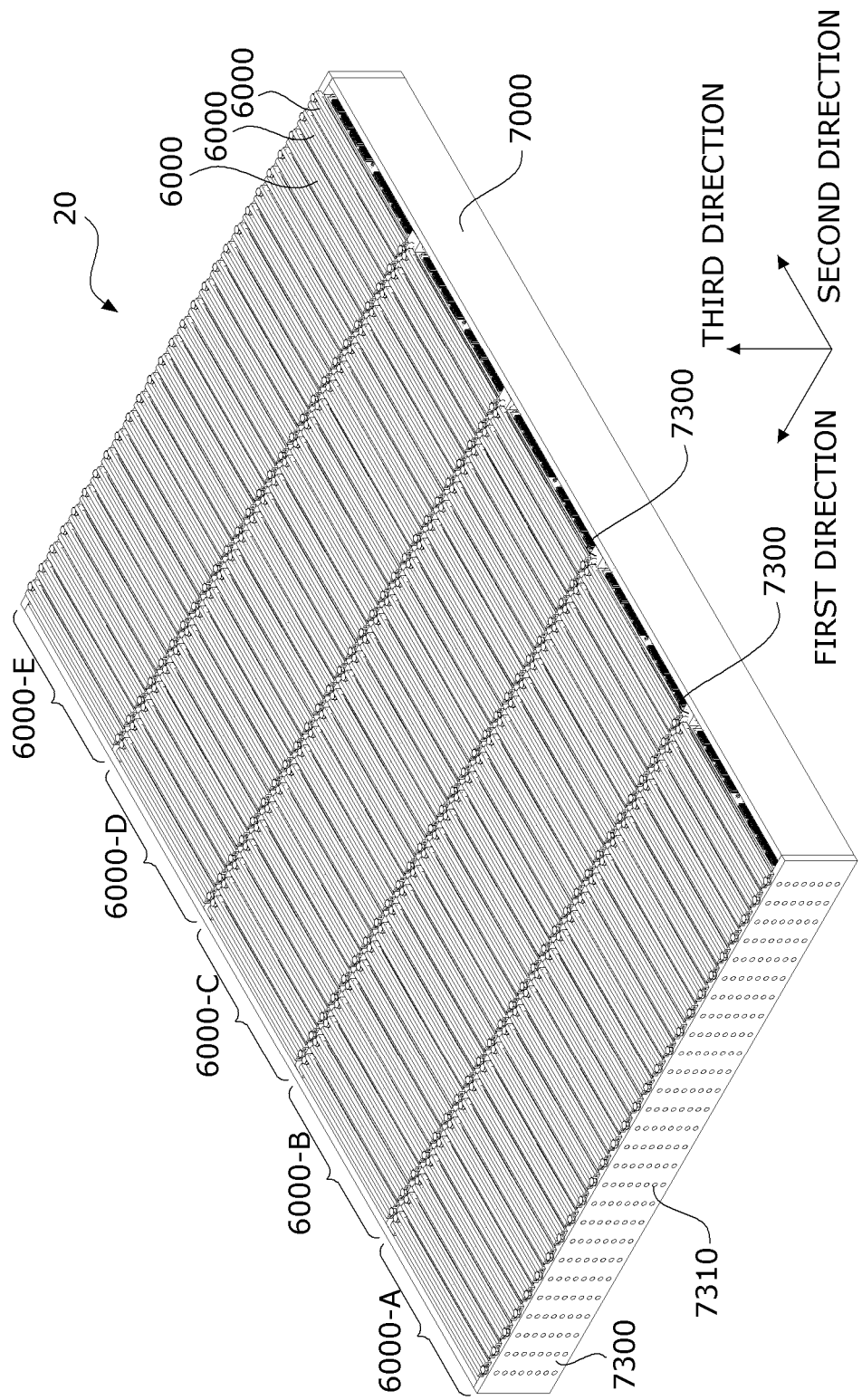
[FIG. 15]

[FIG. 16]
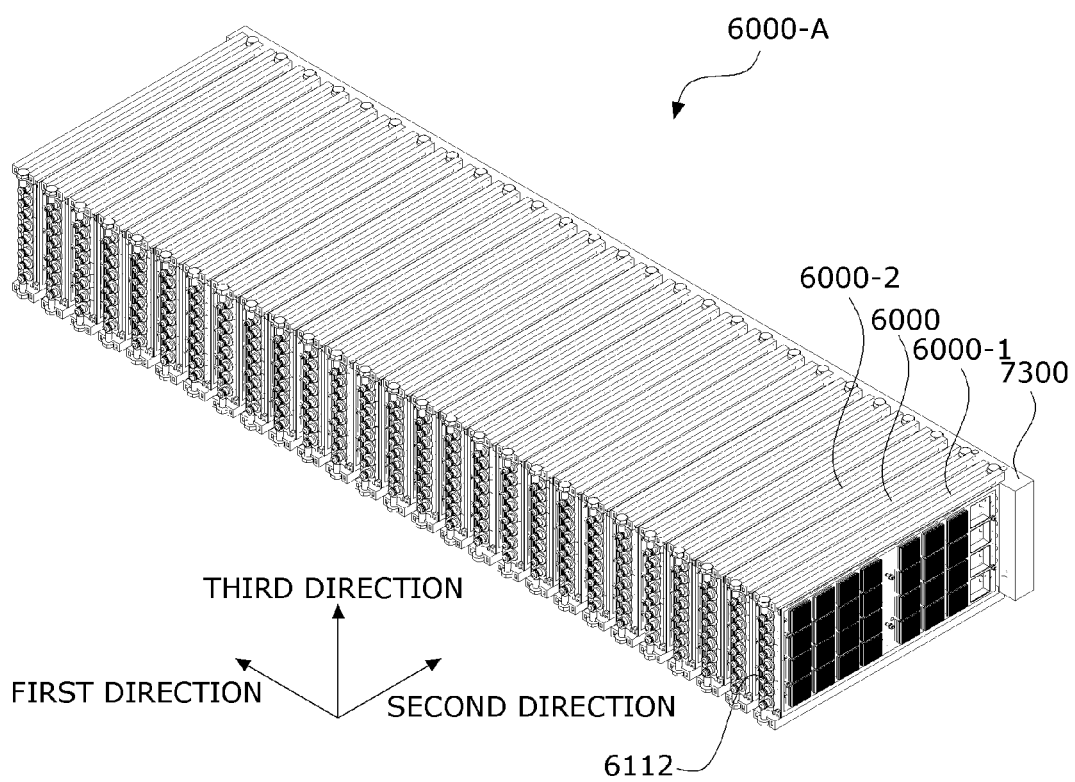

[FIG. 17]
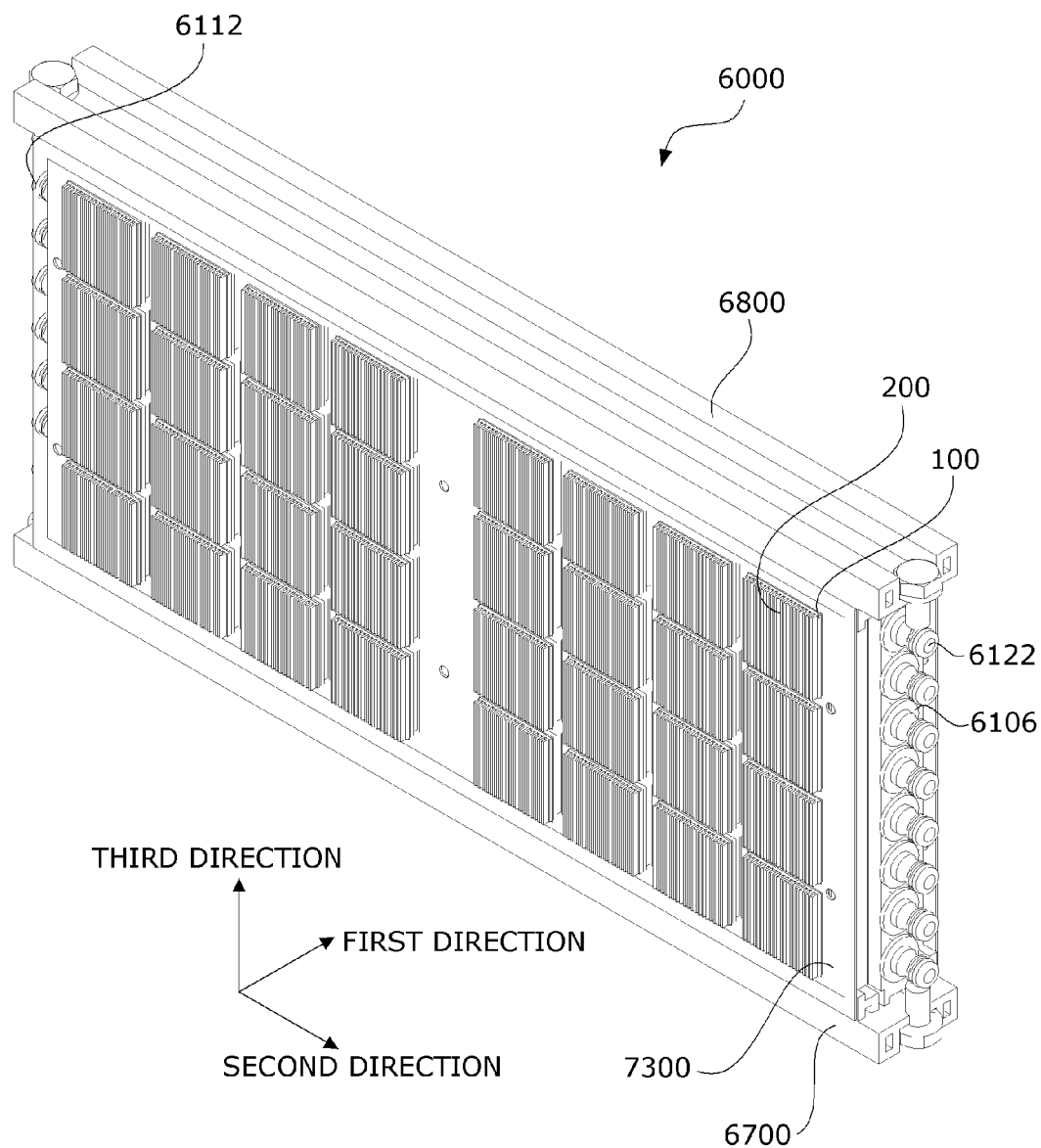

[FIG. 18]
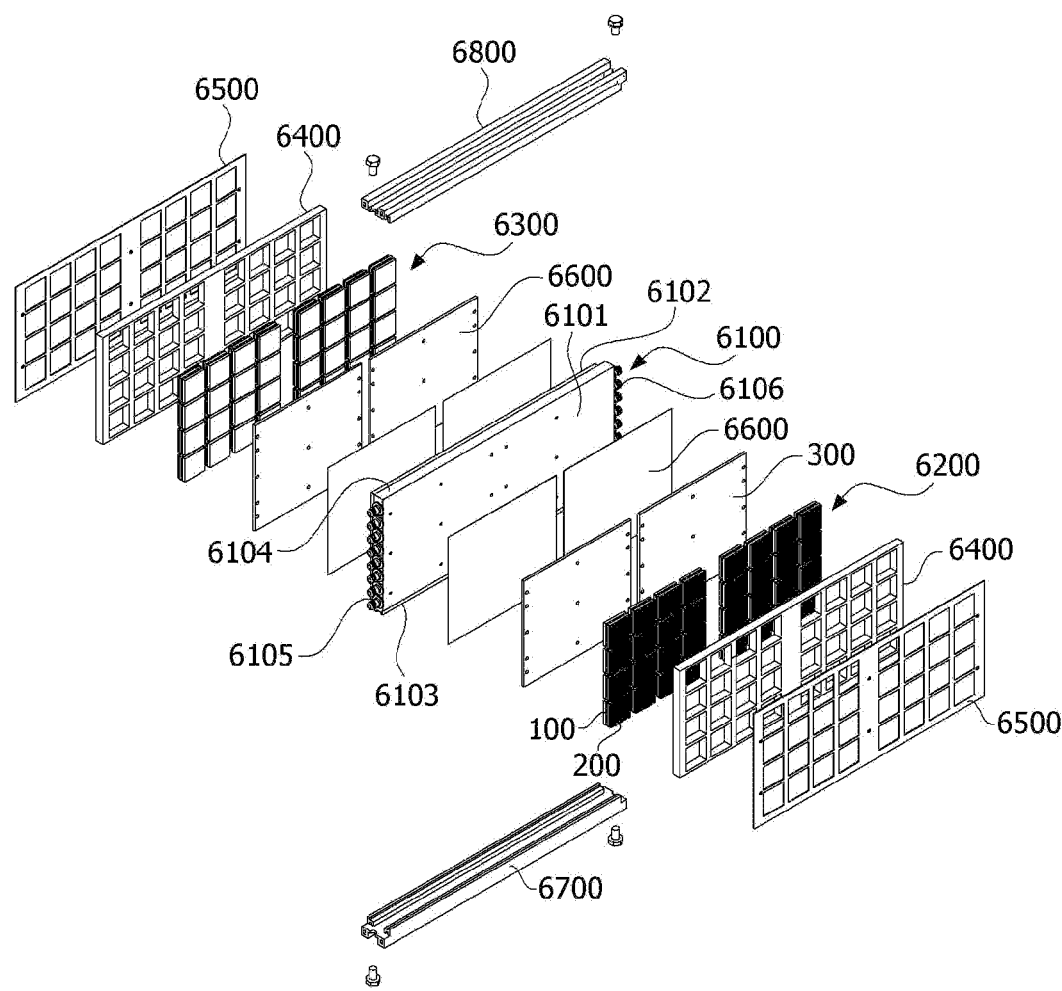

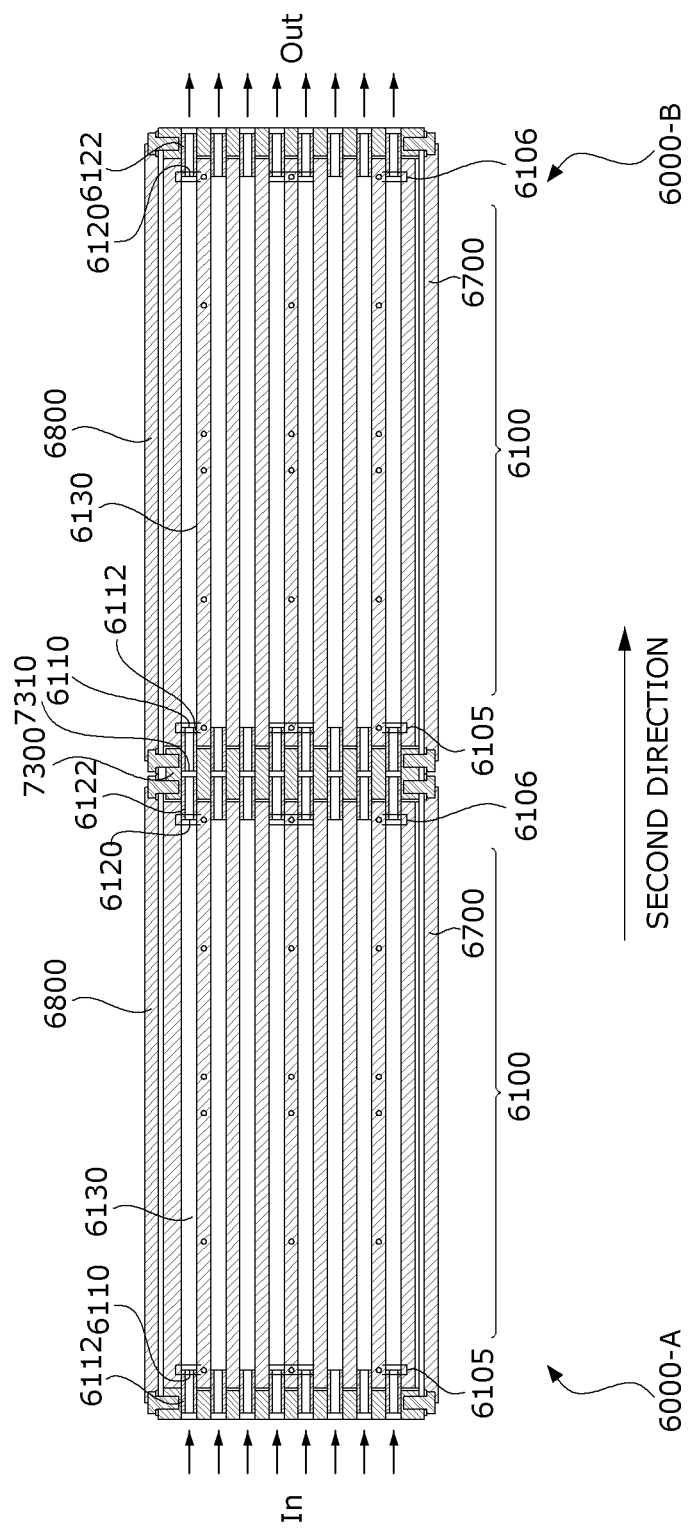

HEAT CONVERSION DEVICE

CROSS-REFERENCE TO RELATED PATENT APPLICATIONS

This application is a U.S. National Stage Application under 35 U.S.C. § 371 of PCT Application No. PCT/KR2019/008239, filed Jul. 4, 2019, which claims priority to Korean Patent Application Nos. 10-2018-0079401, filed Jul. 9, 2018 and 10-2018-0081162, filed Jul. 12, 2018, whose entire disclosures are hereby incorporated by reference.

TECHNICAL FIELD

The present invention relates to a heat conversion device, and more particularly, to a heat conversion device that generates electricity using heat of hot gas.

BACKGROUND ART

The thermoelectric phenomenon is a phenomenon that is generated by the movement of electrons and holes in materials and means direct energy conversion between heat and electricity.

Thermoelectric elements refer to elements using the thermoelectric phenomenon and have a structure in which a P-type thermoelectric material and an N-type thermoelectric material are joined between metal electrodes to form a PN junction pair.

The thermoelectric elements may be classified into elements that use a temperature change in an electrical resistor, elements that use the SeeBeck effect which is a phenomenon in which an electromotive force is generated due to a temperature difference, elements that use the Peltier effect which is a phenomenon in which heat absorption or heat generation occurs due to a current, and the like.

The thermoelectric elements are variously applied to home appliances, electronic components, communication components, and the like. For example, the thermoelectric elements may be applied to cooling devices, heating devices, power generation devices, and the like. Accordingly, the demand of thermoelectric performance of the thermoelectric elements is increasing more and more.

In recent years, there is a need to generate electricity using waste heat generated from engines of automobiles, ships, and the like and the thermoelectric elements. In this case, a structure for increasing power generation performance is required.

In this way, in the case of a power generation device using waste heat, improvement of assembly properties and possibility of replacement of some modules are required and a structure for supporting a region through which cooling water passes due to the weight of the cooling water is also required.

DISCLOSURE

Technical Problem

The present invention is directed to providing a heat conversion device that generates power using waste heat.

Technical Solution

One aspect of the present invention provides a heat conversion device including a plurality of unit modules arranged in each of a first direction and a second direction intersecting the first direction, a frame configured to support the plurality of unit modules and including a first cooling water inflow tube and a first cooling water discharge tube formed in the first direction, a plurality of second cooling water inflow tubes connected to the first cooling water inflow tube and arranged on one sides of the plurality of unit modules in the second direction, and a plurality of second cooling water discharge tubes connected to the first cooling water discharge tube and arranged on the other sides of the plurality of unit modules in the second direction, wherein each unit module includes a cooling water passage chamber, a first thermoelectric module disposed on a first surface of the cooling water passage chamber, and a second thermoelectric module disposed on a second surface of the cooling water passage chamber, a cooling water inflow port is formed in a third surface between the first and second surfaces of the cooling water passage chamber and a cooling water discharge port is formed in a fourth surface between the first and second surfaces of the cooling water passage chamber, and the cooling water inflow port is connected to the second cooling water inflow tubes and the cooling water discharge port is connected to the second cooling water discharge tubes.

The plurality of unit modules arranged in the first direction may be spaced apart from each other by a predetermined interval.

Gas may pass through a separation space between the unit modules spaced apart from each other by the predetermined interval, and the temperature of the gas may be higher than the temperature of cooling water of the cooling water passage chamber.

The gas may pass in a direction from the second cooling water discharge tubes to the second cooling water inflow tubes, and the cooling water in the cooling water passage chamber may flow in a direction from the second cooling water inflow tubes to the second cooling water discharge tubes.

A cross-sectional area of the first cooling water inflow tube may be larger than a cross-sectional area of the second cooling water inflow tubes, and a cross-sectional area of the first cooling water discharge tube may be larger than a cross-sectional area of the second cooling water discharge tubes.

A pair of the second cooling water inflow tube and the second cooling water discharge tube may be connected to the plurality of unit modules arranged in the second direction.

The frame may further include a support wall disposed between the plurality of unit modules arranged in the second direction.

First grooves and second grooves may be formed at both ends of the support wall, the second cooling water inflow tubes may be fixed to the first grooves, and the second cooling water discharge tubes may be fixed to the second grooves.

Cooling water introduced into the first cooling water inflow tube may pass through the cooling water passage chamber via the second cooling water inflow tubes and be then discharged to the first cooling water discharge tube via the second cooling water discharge tubes.

The plurality of unit modules may include a first unit module and a second unit module disposed to be adjacent to the first unit module in the first direction, a first thermoelectric module of the first unit module may include a first thermoelectric element disposed on the first surface and a first heat sink, a second thermoelectric module of the second unit module may include a second thermoelectric element disposed on the second surface and a second heat sink disposed in the second thermoelectric element, and the first heat sink and the second heat sink may be arranged to face each other at predetermined intervals.

The first thermoelectric module and the second thermoelectric module may include a plurality of first thermoelectric elements and a plurality of second thermoelectric elements, and the first unit module and the second unit module may further include a first heat insulation layer disposed between the plurality of first thermoelectric elements and a second heat insulation layer disposed between the plurality of second thermoelectric elements.

As a distance from an inlet of the first cooling water inflow tube increases, the cross-sectional area of the first cooling water inflow tube may decrease.

Another aspect of the present invention provides a heat conversion device including a plurality of unit module groups including a first unit module group and a second unit module group, and a frame supporting the plurality of unit module groups, wherein each of the first unit module group and the second unit module group includes a plurality of unit modules spaced apart from each other by a predetermined interval in a first direction, the first unit module group and the second unit module group are arranged in a second direction intersecting the first direction, each unit module includes a cooling water passage chamber, a first thermoelectric module disposed on a first surface of the cooling water passage chamber, a second thermoelectric module disposed on a second surface of the cooling water passage chamber, a first support frame disposed on a third surface between the first surface and the second surface of the cooling water passage chamber, and a second support frame disposed on a fourth surface between the first surface and the second surface of the cooling water passage chamber, a cooling water inflow port is formed in a fifth surface between the first surface, the second surface, the third surface, and the fourth surface of the cooling water passage chamber, and a cooling water discharge port is formed in a sixth surface between the first surface, the second surface, the third surface, and the fourth surface.

The frame may include a support wall disposed between the first unit module group and the second unit module group, a hole may be formed in the support wall to correspond to the position of the cooling water inflow port and the position of the cooling water discharge port, and the cooling water discharge port of one of the plurality of unit modules included in the first unit module group may be connected, through the hole, to the cooling water inflow port of one of the plurality of unit modules included in the second unit module group.

A first fitting member may be connected to the cooling water inflow port, a second fitting member may be connected to the cooling water discharge port, and the second fitting member connected to the cooling water discharge port of one of the plurality of unit modules included in the first unit module group and the first fitting member connected to the cooling water inflow port of one of the plurality of unit modules included in the second unit module group may be fitted in the hole.

The outer peripheral surface of the first fitting member, the outer peripheral surface of the second fitting member, and the inner peripheral surface of the hole may be sealed together.

A plurality of the cooling water inflow ports and a plurality of the cooling water discharge ports may be formed in the fifth and sixth surfaces of the cooling water passage chamber, and a plurality of holes may be formed in the support wall to correspond to the positions of the plurality of cooling water inflow ports and the positions of the plurality of cooling water discharge ports.

Gas may pass through a separation space between the unit modules spaced apart from each other by the predetermined interval, and the temperature of the gas may be higher than the temperature of the cooling water of the cooling water passage chamber.

The gas may flow in a third direction intersecting the first direction and the second direction, a cooling water passage tube connected from the cooling water inflow port to the cooling water discharge port may be formed inside the cooling water passage chamber, and the cooling water may flow in the second direction through the cooling water passage tube.

At least one of the first support frame and the second support frame may have an H shape.

The first unit module group may include a first unit module and a second unit module disposed to be adjacent to the first unit module in the first direction, a first thermoelectric module of the first unit module may include a first thermoelectric element disposed on the first surface and a first heat sink, a second thermoelectric module of the second unit module may include a second thermoelectric element disposed on the second surface and a second heat sink disposed in the second thermoelectric element, and the first heat sink and the second heat sink may be arranged to face each other at predetermined intervals.

Advantageous Effects

According to embodiments of the present invention, a heat conversion device that is easily assembled and has excellent power generation performance can be obtained. Further, according to the embodiments of the present invention, the power generation capacity can be adjusted by adjusting the number of unit modules, and replacement and repair of some unit modules are easy. Further, according to the embodiments of the present invention, since the unit module is stably supported, the unit module is not easily deformed even in an environment in which vibration occurs, and thus reliability can be maintained.

DESCRIPTION OF DRAWINGS

FIG. 1 is a perspective view of a heat conversion device according to an embodiment of the present invention.

FIG. 2 is a partially enlarged view of the heat conversion device according to the embodiment of the present invention.

FIG. 3 is a sectional view of FIG. 2 in a first direction.

FIG. 4 is a perspective view of a unit module of the heat conversion device according to the embodiment of the present invention.

FIG. 5 is an exploded view of the unit module of FIG. 4.

FIGS. 6A and 6B show sectional views of a thermoelectric element included in a thermoelectric module according to the embodiment of the present invention.

FIG. 7 is a perspective view of the thermoelectric element included in the thermoelectric module according to the embodiment of the present invention.

FIGS. 8 and 9 are views for describing an assembling process of the heat conversion device according to the embodiment of the present invention.

FIGS. 10 and 11 are views for describing a direction in which high-temperature gas and cooling water flow in the heat conversion device according to the embodiment of the present invention.

FIG. 12 is a top view of a heat conversion device according to another embodiment of the present invention.

FIG. 13 is a perspective view of the heat conversion device of FIG. 12.

FIG. 14 is a perspective view of a heat conversion device according to still another embodiment of the present invention.

FIG. 15 is a perspective view of a heat conversion device according to yet another embodiment of the present invention.

FIG. 16 is a partially enlarged view of the heat conversion device according to the embodiment of FIG. 15.

FIG. 17 is a perspective view of a unit module included in the heat conversion device according to the embodiment of FIG. 15.

FIG. 18 is an exploded view of the unit module of FIG. 17.

FIG. 19 is a sectional view of the heat conversion device according to another embodiment of FIG. 15.

MODES OF THE INVENTION

The present invention may be modified in various changes and may have various embodiments and is thus intended to illustrate and describe specific embodiments in the drawings. However, it should be understood that the present invention is not limited to a specific embodiment and includes all changes, equivalents, and substitutes included in the spirit and scope of the present invention.

Terms including an ordinal number such as second and first may be used to describe various components, but the components are not limited by the terms. The terms are used only for the purpose of distinguishing one component from another component. For example, without departing from the scope of the present invention, a second component may be referred to as a first component, and similarly, the first component may be referred to as the second component. The term "and/or" includes a combination of a plurality of related listed items or any of the plurality of related listed items.

It should be understood that, when it is referenced that a first component is "connected" or "coupled" to a second component, the first component may be directly connected or coupled to the second component or a third component may be present between the first component and the second component. On the other hand, it should be understood that, when a first component is "directly connected" or "directly coupled" to a second component, a third component is not present therebetween.

Terms used in the present application are used only to describe specific embodiments and are not intended to limit the present invention. Singular expressions include plural expressions unless clearly otherwise indicated in the context. It should be understood in the present application that terms such as "include" or "have" are intended to indicate that there are features, numbers, steps, operations, components, parts, or combinations thereof that are described in the specification and do not exclude in advance the possibility of the presence or addition of one or more other features, numbers, steps, operations, components, parts, or combinations thereof.

Unless otherwise defined, all terms used herein including technical or scientific terms have the same meanings as those commonly understood by those skilled in the art to which the present invention belongs. Terms defined in commonly used dictionaries should be interpreted as having the same meanings in the context of the related art and may not be interpreted with ideal or excessively formal meanings, unless explicitly defined in the present application.

Hereinafter, embodiments will be described in detail with reference to the accompanying drawings, the same or corresponding components are designated by the same reference numerals regardless of the reference numerals, and the duplicated description thereof will be omitted.

FIG. 1 is a perspective view of a heat conversion device according to an embodiment of the present invention, FIG. 2 is a partially enlarged view of the heat conversion device according to the embodiment of the present invention, FIG. 3 is a sectional view of FIG. 2 in a first direction, FIG. 4 is a perspective view of a unit module of the heat conversion device according to the embodiment of the present invention, and FIG. 5 is an exploded view of the unit module of FIG. 4. FIG. 6 shows sectional views of a thermoelectric element included in a thermoelectric module according to the embodiment of the present invention, and FIG. 7 is a perspective view of the thermoelectric element included in the thermoelectric module according to the embodiment of the present invention. FIGS. 8 and 9 are views for describing an assembling process of the heat conversion device according to the embodiment of the present invention, and FIGS. 10 and 11 are views for describing a direction in which high-temperature gas and cooling water flow in the heat conversion device according to the embodiment of the present invention.

Referring to FIGS. 1 to 11, a heat conversion device 10 includes a plurality of unit modules 1000 and a frame 2000 supporting the plurality of unit modules 1000.

Here, the plurality of unit modules 1000 may be arranged in each of a first direction and a second direction, and the second direction is a direction intersecting the first direction, for example, a direction perpendicular to the first direction. In the present specification, the plurality of unit modules 1000 arranged in the first direction may be described as forming one unit module group, and accordingly, the plurality of unit module groups may be arranged in the second direction. Here, the plurality of unit modules 1000 included in the one unit module group may be arranged to be spaced apart from each other by a predetermined interval.

The frame 2000 may be a frame or edge disposed to surround the outer periphery of the plurality of unit modules 1000. In this case, the frame 2000 may include cooling water inflow tubes for injecting cooling water into the plurality of unit modules 1000 and cooling water discharge tubes for discharging the cooling water passing through the insides of the plurality of unit modules 1000. To this end, the frame 2000 may include a first cooling water inflow tube 2100 and a first cooling water discharge tube 2200 formed in the first direction. The first cooling water inflow tubes 2100 and the first cooling water discharge tubes 2200 may be formed in the first direction on side surfaces, which are arranged at both borders of the plurality of unit modules 1000, of the unit module group. To this end, the first cooling water inflow tubes 2100 and the first cooling water discharge tubes 2200 may be formed in edges, which are arranged on the side surfaces of the unit module group arranged at both of the borders of the plurality of unit modules 1000, among the edges constituting the frame 2000. In this case, the first cooling water inflow tubes 2100 may be formed in lower portions of the edges, and the first cooling water discharge tubes 2200 may be formed in upper portions of the edges. Accordingly, the cooling water heated while passing through the plurality of unit modules 1000 may be easily discharged to the outside using the convection phenomenon.

The heat conversion device 10 according to the embodiment of the present invention may further include a plurality of second cooling water inflow tubes 3000 connected to the first cooling water inflow tubes 2100 of the frame 2000 and arranged on one sides of the plurality of the plurality of unit modules 1000 in the second direction and a plurality of second cooling water discharge tubes 4000 connected to the first cooling water discharge tubes 2200 of the frame 2000 and arranged on the other sides of the plurality of unit modules 1000 in the second direction. Here, the one sides of the plurality of unit modules 1000 may mean lower portions of the plurality of unit modules 1000 in a third direction intersecting the first direction and the second direction, and the other sides of the plurality of unit modules 1000 may mean upper portions of the plurality of the unit modules 1000 in the third direction.

Meanwhile, each unit module 1000 includes a cooling water passage chamber 1100, a first thermoelectric module 1200 disposed on one surface 1101 of the cooling water passage chamber 1100, and a second thermoelectric module 1300 disposed on the other surface 1102 of the cooling water passage chamber 1100. Here, the one surface 1101 and the other surface 1102 of the cooling water passage chamber 1100 may be both surfaces arranged to be spaced apart from each other in the first direction by a predetermined interval, and in the present specification, the one surface 1101 and the other surface 1102 of the cooling water passage chamber 1100 are interchangeable with a first surface and a second surface of the cooling water passage chamber 1100. A low temperature part, that is, a heat radiation part, of the first thermoelectric module 1200 may be disposed on the outer surface of the first surface 1101 of the cooling water passage chamber 1100, and a high temperature part, that is, a heat absorption part, of the first thermoelectric module 1200 may be disposed to face the second thermoelectric module 1300 of another adjacent unit module 1000. Likewise, a low temperature part, that is, a heat radiation part, of the second thermoelectric module 1300 may be disposed on the outer surface of the second surface 1102 of the cooling water passage chamber 1100, and a high temperature part, that is, a heat absorption part, of the second thermoelectric module 1300 may be disposed to face the first thermoelectric module 1200 of another adjacent unit thermoelectric module 1000.

The heat conversion device 10 according to the embodiment of the present invention may generate electric power by using a temperature difference between the cooling water flowing through the cooling water passage chamber 1100 and high-temperature gas passing through a separation space between the plurality of unit modules 1000, that is, a temperature difference between the heat absorption part and the heat radiation part of the first thermoelectric module 1200 and a temperature difference between the heat absorption part and the heat radiation part of the second thermoelectric module 1300. Here, the cooling water may be water but is not limited thereto and may be various types of fluids having cooling performance. The temperature of the cooling water flowing into the cooling water passage chamber 1100 may be less than 100° C., preferably less than 50° C., and more preferably less than 40° C., but is not limited thereto. The temperature of the cooling water discharged after passing through the cooling water passage chamber 1100 may be higher than the temperature of the cooling water introduced into the cooling water passage chamber 1100. The temperature of the high-temperature gas passing through the separation space between the plurality of unit modules 1000 may be higher than the temperature of the cooling water. For example, the temperature of the high-temperature gas passing through the separation space between the plurality of unit modules 1000 may be 100° C. or more, preferably 150° C. or more, and more preferably 200° C. or more, but is not limited thereto. In this case, the width of the separation space between the plurality of unit modules 1000 may be several millimeters to several tens of millimeters, and may vary depending on the size of the heat conversion device, the temperature of introduced gas, the inflow rate of the gas, the required amount of power generation, and the like.

In particular, referring to FIGS. 4 and 5, the first thermoelectric module 1200 and the second thermoelectric module 1300 may each include a plurality of thermoelectric elements 100. The number of thermoelectric elements included in each thermoelectric module may be adjusted depending on the required amount of power generation.

The plurality of thermoelectric elements 100 included in each thermoelectric module may be electrically connected to each other, and at least some of the plurality of thermoelectric elements 100 may be electrically connected to each other using a bus bar (not illustrated). For example, the bus bar may be disposed on a side of a discharge port through which the high-temperature gas is discharged after passing through the separation space between the plurality of unit modules 1000 and may be connected to an external terminal. Accordingly, even while a printed circuit board (PCB) for the first thermoelectric module 1200 and the second thermoelectric module 1300 is not disposed inside the heat conversion device, power may be supplied to the first thermoelectric module 1200 and the second thermoelectric module 1300, and accordingly, the design and assembly of the heat conversion device 10 is easy. Each unit module 1000 may further include a heat insulation layer 1400 and a shield layer 1500 arranged between the plurality of thermoelectric elements 100. The heat insulation layer 1400 may be disposed to surround at least a portion of the outer surface of the cooling water passage chamber 1100 except for a region in which the thermoelectric element 100 is disposed among the outer surface of the cooling water passage chamber 1100. In particular, when the heat insulation layer 1400 is disposed between the thermoelectric elements 100 on the first surface 1101 and the second surface 1102 on which the plurality of thermoelectric elements 100 are arranged among the outer surface of the cooling water passage chamber 1100, heat insulation between a low-temperature portion and a high-temperature portion may be maintained due to the heat insulation layer 1400, thereby increasing power generation efficiency.

Further, the shield layer 1500 may be disposed on the heat insulation layer 1400 and protect the heat insulation layer 1400 and the plurality of thermoelectric elements 100. To this end, the shield layer 1500 may include a stainless material.

The shield layer 1500 and the cooling water passage chamber 1100 may be fastened to each other by screws. Accordingly, the shield layer 1500 may be stably coupled to the unit module 1000 and the first thermoelectric module 1200 or the second thermoelectric module 1300 and the heat insulation layer 1400 may be fixed together.

In this case, each of the first thermoelectric module 1200 and the second thermoelectric module 1300 may adhere to the first surface 1101 and the second surface 1102 of the cooling water passage chamber 1100 using a thermal pad. Since the thermal pad facilitates heat transfer, the heat transfer between the cooling water passage chamber 1100 and the thermoelectric module may not be disturbed. Further, each of the first thermoelectric module 1200 and the second thermoelectric module 1300 may further include a heat sink disposed on the high-temperature portion side of the thermoelectric element 100 and a metal plate 300, for example, an aluminum plate, disposed on the low-temperature portion side of the thermoelectric element 100. In this case, the heat sink 200 is disposed toward another adjacent unit module 1000. The heat sink 200 included in the first thermoelectric module 1200 may be disposed toward the second thermoelectric module 1300 of another adjacent unit module 1000, and the heat sink 200 included in the second thermoelectric module 1300 may be disposed toward the first thermoelectric module 1200 of still another adjacent unit module 1000. In this case, the heat sinks 200 of different adjacent unit modules 1000 may be spaced apart from each other by a predetermined interval. Accordingly, the temperature of air passing between the plurality of unit modules 1000 may be efficiently transferred to the high-temperature portion side of the thermoelectric element 100 through the heat sinks 200. Meanwhile, since the metal plate 300, for example, the aluminum plate, has high heat transfer efficiency, the temperature of the cooling water passing through the cooling water passage chamber 1100 may be efficiently transferred to the low-temperature portion side of the thermoelectric element 100 through the metal plate 300.

Referring to FIGS. 6 to 7, each thermoelectric element 100 includes a first substrate 110, a plurality of first electrodes 120 arranged on the first substrate 110, a plurality of P-type thermoelectric legs 130 and a plurality of N-type thermoelectric legs 140 arranged on the plurality of first electrodes 120, a plurality of second electrodes 150 arranged on the plurality of P-type thermoelectric legs 130 and the plurality of N-type thermoelectric legs 140, and a second substrate 160 disposed on the plurality of second electrodes 150.

In this case, the first electrodes 120 may be arranged between the first substrate 110 and lower bottom surfaces of the P-type thermoelectric legs 130 and the N-type thermoelectric legs 140, and the second electrodes 150 may be arranged between the second substrate 160 and upper bottom surfaces of the P-type thermoelectric legs 130 and the N-type thermoelectric legs 140. Accordingly, the plurality of P-type thermoelectric legs 130 and the plurality of N-type thermoelectric legs 140 may be electrically connected to each other through the first electrodes 120 and the second electrodes 150. A pair of the P-type thermoelectric leg 130 and the N-type thermoelectric leg 140, which are arranged between the first electrode 120 and the second electrode 150 and electrically connected to each other, may form a unit cell.

Here, the P-type thermoelectric leg 130 and the N-type thermoelectric leg 140 may be a bismuth telluride (Bi—Te)-based thermoelectric leg containing bismuth (Bi) and tellurium (Ti) as main raw materials. The P-type thermoelectric leg 130 may be a thermoelectric leg containing, based on 100 wt % of the total weight, a total of 99 wt % to 99.999 wt % bismuth telluride (Bi—Te)-based main raw material containing at least one of antimony (Sb), nickel (Ni), aluminum (Al), copper (Cu), silver (Ag), lead (Pb), boron (B), gallium (Ga), tellurium (Te), bismuth (Bi), and indium (In), and 0.001 wt % to 1 wt % mixture including Bi or Te. For example, the P-type thermoelectric leg 130 may have a main raw material of Bi—Se—Te and may further contain 0.001 wt % to 1 wt % Bi or Te based on the total weight. The N-type thermoelectric leg 140 may be a thermoelectric leg containing, based on 100 wt % of the total weight, a total of 99 wt % to 99.999 wt % bismuth telluride (Bi—Te)-based main raw material containing at least one of selenium (Se), nickel (Ni), aluminum (Al), copper (Cu), silver (Ag), lead (Pb), boron (B), gallium (Ga), tellurium (Te), bismuth (Bi), and indium (In), and 0.001 wt % to 1 wt % mixture including Bi or Te. For example, the N-type thermoelectric leg 140 may have a main raw material of Bi—Sb—Te and may further contain 0.001 wt % to 1 wt % Bi or Te based on the total weight.

The P-type thermoelectric leg 130 and the N-type thermoelectric leg 140 may be formed in a bulk type or a stacked type. In general, the bulk-type P-type thermoelectric leg 130 or the bulk-type N-type thermoelectric leg 140 may be obtained through a process of producing an ingot by heat-treating a thermoelectric material, obtaining powder for a thermoelectric leg by pulverizing and sieving the ingot, sintering the powder, and then cutting the sintered object. The laminate-type P-type thermoelectric leg 130 or the laminate-type N-type thermoelectric leg 140 may be obtained through a process of forming a unit member by applying a paste containing a thermoelectric material on a sheet-shaped substrate and then laminating and cutting the unit member.

In this case, the pair of P-type thermoelectric leg 130 and N-type thermoelectric leg 140 may have the same shape and volume or may have different shapes and volumes. For example, since the P-type thermoelectric leg 130 and the N-type thermoelectric leg 140 have different electric conduction characteristics, the height or cross-sectional area of the N-type thermoelectric leg 140 may be different from the height or cross-sectional area of the P-type thermoelectric leg 130.

The performance of the thermoelectric element according to the embodiment of the present invention may be expressed by the Seebeck index. The Seebeck index (ZT) may be expressed as in Equation 1.

$$ZT = \alpha^2 \cdot \sigma \cdot T / k \qquad \text{[Equation 1]}$$

Here, $\alpha$ denotes a Seebeck coefficient [V/K], $\sigma$ denotes an electrical conductivity [S/m], and $\alpha 2\sigma$ denotes a power factor [W/mK2]. Further, T denotes a temperature, and k denotes a thermal conductivity [W/mK]. k may be expressed as $a \cdot cp \cdot \rho$, a denotes a thermal diffusivity [cm2/S], cp denotes a specific heat [J/gK], and $\rho$ denotes a density [g/cm3].

In order to obtain the Seebeck index of the thermoelectric element, the Seebeck index ZT may be calculated by measuring a Z value (V/K) using a Z meter and using the measured Z value.

According to another embodiment of the present invention, the P-type thermoelectric leg 130 and the N-type thermoelectric leg 140 may have a structure illustrated in FIG. 6B. Referring to FIG. 6B, the thermoelectric legs 130 and 140 include thermoelectric material layers 132 and 143, first plating layers 134-1 and 144-1 laminated on one surfaces of the thermoelectric material layers 132 and 142, second plating layers 134-2 and 144-2 laminated on the other surfaces opposite to the one surfaces of the thermoelectric material layers 132 and 142, first bonding layers 136-1 and 146-1 and second bonding layers 136-2 and 146-2 arranged between the thermoelectric material layers 132 and 142 and the first plating layers 134-1 and 144-1 and between the thermoelectric material layers 132 and 142 and the second plating layers 134-2 and 144-2, and first metal layers 138-1 and 148-1 and second metal layers 138-2 and 148-2 laminated on the first plating layers 134-1 and 144-1 and the second plating layers 134-2 and 144-2.

In this case, the thermoelectric material layers 132 and 142 and the first bonding layers 136-1 and 146-1 may be in direct contact with each other, and the thermoelectric material layers 132 and 142 and the second bonding layers 136-2 and 146-2 may be in direct contact with each other. Further, the first bonding layers 136-1 and 146-1 and the first plating layers 134-1 and 144-1 may be in direct contact with each other, and the second bonding layers 136-2 and 146-2 and the second plating layers 134-2 and 144-2 may be in direct contact with each other. Further, the first plating layers 134-1 and 144-1 and the first metal layers 138-1 and 148-1 may be in direct contact with each other, and the second plating layers 134-2 and 144-2 and the second metal layers 138-2 and 148-2 may be in direct contact with each other.

Here, the thermoelectric material layers 132 and 142 may contain bismuth (Bi) and tellurium (Te) which are semiconductor materials. The thermoelectric material layers 132 and 142 may have the same material or shape as the P-type thermoelectric leg 130 or the N-type thermoelectric leg 140 described in FIG. 6A.

Further, the first metal layers 138-1 and 148-1 and the second metal layers 138-2 and 148-2 may include one selected from copper (Cu), copper alloy, aluminum (Al), and aluminum alloy and may have a thickness of 0.1 mm to 0.5 mm, and preferably, 0.2 mm to 0.3 mm. Since the coefficients of thermal expansion of the first metal layers 138-1 and 148-1 and the second metal layers 138-2 and 148-2 are larger than or similar to the coefficients of thermal expansion of the thermoelectric material layers 132 and 142, compressive stress is applied to interfaces between the first metal layers 138-1 and 148-1 and the second metal layers 138-2 and 148-2 and the thermoelectric material layers 132 and 142 during sintering, and thus cracking or peeling may be prevented. Further, since the coupling force between the first metal layers 138-1 and 148-1 and the second metal layers 138-2 and 148-2 and the electrodes 120 and 150 is high, the thermoelectric legs 130 and 140 may be stably coupled to the electrodes 120 and 150.

Next, the first plating layers 134-1 and 144-1 and the second plating layers 134-2 and 144-2 may contain at least one of Ni, Sn, Ti, Fe, Sb, Cr, and Mo and may have a thickness of 1 μm to 20 μm, and preferably 1 μm to 10 μm. Since the first plating layers 134-1 and 144-1 and the second plating layers 134-2 and 144-2 prevent the reaction between Bi or Te, which are semiconductor materials in the thermoelectric material layers 132 and 142, and the first metal layers 138-1 and 148-1 and the second metal layers 138-2 and 148-2, the degradation of the thermoelectric elements may be prevented and the oxidation of the first metal layers 138-1 and 148-1 and the second metal layers 138-2 and 148-2 may be prevented.

In this case, the first bonding layers 136-1 and 146-1 and the second bonding layers 136-2 and 146-2 may be arranged between the thermoelectric material layers 132 and 142 and the first plating layers 134-1 and 144-1 and between the thermoelectric material layers 132 and 142 and the second plating layers 134-2 and 144-2. In this case, the first bonding layers 136-1 and 146-1 and the second bonding layers 136-2 and 146-2 may contain Te. For example, the first bonding layers 136-1 and 146-1 and the second bonding layers 136-2 and 146-2 may contain at least one of Ni—Te, Sn—Te, Ti—Te, Fe—Te, Sb—Te, Cr—Te, and Mo—Te. According to the embodiment of the present invention, the thickness of the first bonding layers 136-1 and 146-1 and the second bonding layers 136-2 and 146-2 may be 0.5 μm to 100 μm, and preferably, 1 μm to 50 μm. According to the embodiment of the present invention, the first bonding layers 136-1 and 146-1 and the second bonding layers 136-2 and 146-2 containing Te are prearranged between the thermoelectric material layers 132 and 142 and the first plating layers 134-1 and 144-1 and the second plating layers 134-2 and 144-2, and thus Te in the thermoelectric material layers 132 and 142 may be prevented from spreading to the first plating layers 134-1 and 144-1 and the second plating layers 134-2 and 144-2. Accordingly, the occurrence of a Bi-rich region may be prevented.

Accordingly, the Te content is higher than the Bi content from the centers of the thermoelectric material layers 132 and 142 to the interfaces between the thermoelectric material layers 132 and 142 and the first bonding layers 136-1 and 146-1, and the Te content is higher than the Bi content from the centers of the thermoelectric material layers 132 and 142 to the interfaces between the thermoelectric material layers 132 and 142 and the second bonding layers 136-2 and 146-2. The Te content from the centers of the thermoelectric material layers 132 and 142 to the interfaces between the thermoelectric material layers 132 and 142 and the first bonding layers 136-1 and 146-1 or the Te content from the centers of the thermoelectric material layers 132 and 142 to the interfaces between the thermoelectric material layers 132 and 142 and the second bonding layers 136-2 and 146-2 may be 0.8 to 1 time the Te content in the centers of the thermoelectric material layers 132 and 142. For example, the Te content within a thickness of 100 μm from the interfaces between the thermoelectric material layers 132 and 142 and the first bonding layers 136-1 and 146-1 to the centers of the thermoelectric material layers 132 and 142 may be 0.8 to 1 time the Te content in the centers of the thermoelectric material layers 132 and 142. Here, the Te content may be maintained constant even within the thickness of 100 μm from the interfaces between the thermoelectric material layers 132 and 142 and the first bonding layers 136-1 and 146-1 to the centers of the thermoelectric material layers 132 and 142. For example, the change rate of the weight ratio of Te may be in the range of 0.9 to 1 within the thickness of 100 μm from the interfaces between the thermoelectric material layers 132 and 142 and the first bonding layers 136-1 and 146-1 to the centers of the thermoelectric material layers 132 and 142.

Further, the Te content in the first bonding layers 136-1 and 146-1 or the second bonding layers 136-2 and 146-2 may be equal or similar to the Te content in the thermoelectric material layers 132 and 142. For example, the Te content in the first bonding layers 136-1 and 146-1 or the second bonding layers 136-2 and 146-2 may be 0.8 to 1 time, preferably 0.85 to 1 time, more preferably 0.9 to 1 time, and more preferably 0.95 to 1 time the Te content in the thermoelectric material layers 132 and 142. Here, the content may be a weight ratio. For example, when the Te content in the thermoelectric material layers 132 and 142 is 50 wt %, the Te content in the first bonding layers 136-1 and 146-1 or the second bonding layers 136-2 and 146-2 may be in the range of 40 wt % to 50 wt %, preferably 42.5 wt % to 50 wt %, more preferably 45 wt % to 50 wt %, and more preferably 47.5 wt % to 50 wt %. Further, the Te content in the first bonding layers 136-1 and 146-1 or the second bonding layers 136-2 and 16-2 may be larger than an Ni content. The Te content in the first bonding layers 136-1 and 146-1 or the second bonding layers 136-2 and 146-2 is uniform, but the Ni content may decrease from the first bonding layer 136-1 an 146-1 or the second bonding layers 136-2 and 146-2 toward the thermoelectric material layers 132 and 142.

Further, the Te content from the interfaces between the thermoelectric material layers 132 and 142 and the first bonding layers 136-1 and 146-1 or the interfaces between the thermoelectric material layers 132 and 142 and the second bonding layers 136-2 and 146-2 to the interfaces between the first plating layers 136-1 and 146-1 and the first bonding layers 136-1 and 146-1 or the interfaces between the second plating layers 134-2 and 144-2 and the second bonding layers 136-2 and 146-2 may be uniformly distributed. For example, the change rate of the weight ratio of Te from the interfaces between the thermoelectric material layers 132 and 142 and the first bonding layers 136-1 and 146-1 or the interfaces between the thermoelectric material layers 132 and 142 and the second bonding layers 136-2 and 146-2 to the interfaces between the first plating layers 136-1 and 146-1 and the first bonding layers 136-1 and 146-1 or the interfaces between the second plating layers 134-2 and 144-2 and the second bonding layers 136-2 and 146-2 may be in the range of 0.8 to 1. Here, as the change ratio of the weight ratio of Te becomes closer to 1, this may mean that the Te content from the interfaces between the thermoelectric material layers 132 and 142 and the first bonding layers 136-1 and 146-1 or the interfaces between the thermoelectric material layers 132 and 142 and the second bonding layers 136-2 and 146-2 to the interfaces between the first plating layers 136-1 and 146-1 and the first bonding layers 136-1 and 146-1 or the interfaces between the second plating layers 134-2 and 144-2 and the second bonding layers 136-2 and 146-2 is uniformly distributed.

Further, the Te content in a surface in contact with the first plating layers 134-1 and 144-1 in the first bonding layers 136-1 and 146-1, that is, the interfaces between the first plating layers 136-1 and 146-1 and the first bonding layers 136-1 and 146-1 or a surface in contact with the second plating layers 134-2 and 144-2 in the second bonding layers 136-2 and 146-2, that is, the interfaces between the second plating layers 134-2 and 144-2 and the second bonding layers 136-2 and 146-2 may be 0.8 to 1 time, preferably 0.85 to 1 time, more preferably 0.9 to 1 time, and more preferably 0.95 to 1 time the Te content in a surface in contact with the first bonding layers 136-1 and 146-1 in the thermoelectric material layers 132 and 142, that is, the interfaces between the thermoelectric material layers 132 and 142 and the first bonding layers 136-1 and 146-1 or a surface in contact with the second bonding layers 136-2 and 146-2 in the thermoelectric material layers 132 and 142, that is, the interfaces between the thermoelectric material layers 132 and 142 and the second bonding layers 136-2 and 146-2. Here, the content may be a weight ratio.

Further, it may be seen that the Te content in the centers of the thermoelectric material layers 132 and 142 is equal or similar to the Te content in the interfaces between the thermoelectric material layers 132 and 142 and the first bonding layers 136-1 and 146-1 or the interfaces between the thermoelectric material layers 132 and 142 and the second bonding layers 136-2 and 146-2. That is, the Te content in the interfaces between the thermoelectric material layers 132 and 142 and the first bonding layers 136-1 and 146-1 or the interfaces between the thermoelectric material layers 132 and 142 and the second bonding layers 136-2 and 146-2 may be 0.8 to 1 time, preferably 0.85 to 1 time, more preferably 0.9 to 1 time, and more preferably 0.95 to 1 time the Te content in the centers of the thermoelectric material layers 132 and 142. Here, the content may be a weight ratio. Here, the centers of the thermoelectric material layers 132 and 142 may mean a peripheral area including the centers of the thermoelectric material layers 132 and 142. Further, the interface may mean the interface itself or may mean a region including the interface and the peripheral area adjacent to the interface within a predetermined distance.

Further, the Te content in the first plating layers 136-1 and 146-1 or the second plating layers 134-2 and 144-2 may be smaller than the Te content in the thermoelectric material layers 132 and 142 and the Te content in the first bonding layers 136-1 and 146-1 or the second bonding layers 136-2 and 146-2.

Further, it may be seen that the Bi content in the centers of the thermoelectric material layers 132 and 142 is equal or similar to the Bi content in the interfaces between the thermoelectric material layers 132 and 142 and the first bonding layers 136-1 and 146-1 or the interfaces between the thermoelectric material layers 132 and 142 and the second bonding layers 136-2 and 146-2. Accordingly, since the Te content is higher than the Bi content from the centers of the thermoelectric material layers 132 and 142 to the interfaces between the thermoelectric material layers 132 and 142 and the first bonding layers 136-1 and 146-1 or the interfaces between the thermoelectric material layers 132 and 142 and the second bonding layers 136-2 and 146-2, there is no section where the Bi content is not higher than the Te content in a region around the interfaces between the thermoelectric material layers 132 and 142 and the first bonding layers 136-1 and 146-1 or a region around the interfaces between the thermoelectric material layers 132 and 142 and the second bonding layers 136-2 and 146-2. For example, the Bi content in the thermoelectric material layers 132 and 142 may be 0.8 to 1 time, preferably 0.85 to 1 time, more preferably 0.9 to 1 time, and more preferably 0.95 to 1 time the Bi content in the interfaces between the thermoelectric material layers 132 and 142 and the first bonding layers 136-1 and 146-1 or the interfaces between the thermoelectric material layers 132 and 142 and the second bonding layers 136-2 and 146-2. Here, the content may be a weight ratio.

Meanwhile, the first electrode 120 disposed between the first substrate 110 and the P-type thermoelectric leg 130 and the N-type thermoelectric leg 140 and the second electrode 150 disposed between the second substrate 160 and the P-type thermoelectric leg 130 and the N-type thermoelectric leg 140 may contain at least one of copper (Cu), silver (Ag), and nickel (Ni) and have a thickness of 0.01 mm to 0.3 mm. When the thickness of the first electrode 120 or the second electrode 150 is less than 0.01 mm, the function of the first electrode 120 or the second electrode 150 as an electrode is degraded, and thus electric conduction performance may be degraded, and when the thickness of the first electrode 120 or the second electrode 150 is more than 0.3 mm, electric conduction efficiency may be degraded due to an increase in resistance.

Further, the first substrate 110 and the second substrate 160 facing each other may be an insulating substrate or a metal substrate. The insulating substrate may be an aluminum substrate or a polymer resin substrate. The polymer resin substrate may contain various insulation resin materials such as polyimide (PI), polystyrene (PS), polymethyl methacrylate (PMMA), cyclic olefin copoly (COC), and highly permeable plastics such as polyethylene terephthalate (PET).

Otherwise, the polymer resin substrate may be a thermally conductive substrate made of a resin composition containing an epoxy resin and an inorganic filler. The thickness of the thermally conductive substrate may be in the range of 0.01 mm to 0.65 mm, preferably 0.01 mm to 0.6 mm, and more preferably 0.01 mm to 0.55 mm, and the thermal conductivity thereof may be 10 W/mK or more, preferably 20 W/mK or more, and more preferably 30 W/mK.

To this end, the epoxy resin may contain an epoxy compound and a curing agent. In this case, the epoxy resin may include 10 volume ratio of the epoxy compound and a 1 to 10 volume ratio of the curing agent. Here, the epoxy compound may include at least one of a crystalline epoxy compound, an amorphous epoxy compound, and a silicone epoxy compound. The crystalline epoxy compound may include a mesogen structure. The mesogen is a basic unit of liquid crystal and includes a rigid structure. Further, the amorphous epoxy compound may be a general amorphous epoxy compound having two or more epoxy groups in a molecule and may be, for example, a glycidyl ether compound derived from bisphenol A or bisphenol F. Here, the curing agent may include at least one of an amine-based curing agent, a phenol-based curing agent, an acid anhydride-based curing agent, a polymercaptan-based curing agent, a polyaminoamide-based curing agent, an isocyanate-based curing agent, and a block isocyanate-based curing agent, and a mixture of two or more types of the curing agents may be used as the curing agent.

An inorganic filler may include at least one of aluminum oxide, boron nitride, and aluminum nitride. In this case, the boron nitride may include a boron nitride aggregate in which a plurality of plate-shaped boron nitrides are aggregated. Here, the surface of the boron nitride aggregate may be coated with a polymer having Monomer 1 below or at least a portion of voids in the boron nitride aggregate may be filled with the polymer having Monomer 1 below.

Monomer 1 is as follows.

[Monomer 1]

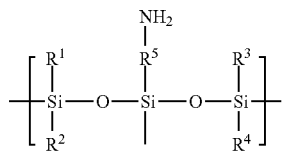

Here, one of $R^1$, $R^2$, $R^3$, and $R^4$ may be H, the rest may be selected from the group consisting of $C_1$-$C_3$ alkyl, $C_2$-$C_3$ alkene, and $C_2$-$C_3$ alkyne, and $R^5$ may be a linear, branched, or cyclic divalent organic linker having 1 to 12 carbon atoms.

In one embodiment, one of $R^1$, $R^2$, $R^3$, and $R^4$ excluding H may be selected from $C_2$-$C_3$ alkene, and another and still another of the rest may be selected from $C_1$-$C_3$ alkyl. For example, the polymer according to the embodiment of the present invention may include Monomer 2 below.

[Monomer 2]

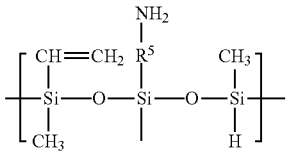

Otherwise, the rest of $R^1$, $R^2$, $R^3$, and $R^4$ except for H may be selected from the group consisting of $C_1$-$C_3$ alkyl, $C_2$-$C_3$ alkene, and $C_2$-$C_3$ alkyne to be different from each other.

In this way, when the polymer according to Monomer 1 or Monomer 2 is applied on the boron nitride aggregate in which the plate-shaped boron nitride is aggregated, and at least a portion of the voids in the boron nitride is filled, an air layer in the boron nitride aggregate is minimized, and thus the heat conduction performance of the boron nitride aggregate may be increased, and a bonding force between the plate-shaped boron nitrides may be increased to prevent the boron nitride aggregate from being broken. Further, when a coating layer is formed on the boron nitride aggregate in which the plate-shaped boron nitride is aggregated, a functional group may be easily formed, and when the functional group is formed on the coating layer of the boron nitride aggregate, the affinity with the resin may be increased.

When the first substrate 110 and the second substrate 160 are polymer resin substrates, the first substrate 110 and the second substrate 160 may have a thinner thickness, higher heat radiation performance, and higher insulation performance than those of a metal substrate. Further, when an electrode is disposed on a semi-cured polymer resin layer applied onto the heat sink 200 or the metal plate 300 and is then thermally compressed, a separate adhesive layer may not be required.

In this case, the first substrate 110 and the second substrate 160 may have different sizes. For example, the volume, the thickness, or the area of one of the first substrate 110 and the second substrate 160 may be formed larger than the volume, the thickness, or the area of the other thereof. Accordingly, heat absorption performance or heat radiation performance of the thermoelectric element may be increased.

Further, a heat radiation pattern, for example, an uneven pattern, may be formed on the surface of one of the first substrate 110 and the second substrate 160. Accordingly, heat radiation performance of the thermoelectric element may be increased. When the uneven pattern is formed on the surface in contact with the P-type thermoelectric leg 130 or the N-type thermoelectric leg 140, a bonding property between the thermoelectric leg and the substrate may be also improved.

Meanwhile, the P-type thermoelectric leg 130 or the N-type thermoelectric leg 140 may have a cylindrical shape, a polygonal column shape, an oval column shape, or the like.

According to the embodiment of the present invention, the P-type thermoelectric leg 130 or the N-type thermoelectric leg 140 may be formed to have a wide width at a portion thereof that is bonded to the electrode.

Referring back to FIGS. 1 to 3, according to the embodiment of the present invention, the second cooling water inflow tubes 3000 and the second cooling water discharge tubes 4000 may be arranged in each of the unit modules 1000 arranged in the first direction. That is, the number of each of the second cooling water inflow tubes 3000 and the second cooling water discharge tubes 4000 may be equal to the number of the unit modules 1000 arranged in the first direction or a multiple of the number of the unit modules 1000 arranged in the first direction.

As illustrated in FIG. 3, the second cooling water inflow tube and the second cooling water discharge tube arranged on the same unit module side, for example, a second cooling water inflow tube 3000-1 and a second cooling water discharge tube 4000-1 arranged on a first unit module 1000-1, may be referred to as a pair of second cooling water inflow tube 3000-1 and second cooling water discharge tube 4000-1.

The cooling water introduced into the first cooling water inflow tube 2100 in the first direction may be distributed and introduced into the plurality of second cooling water inflow tubes 3000. Further, the cooling water discharged from the plurality of second cooling water discharge tubes 4000 may be collected by the first cooling water discharge tube 2200 and then discharged to the outside in the first direction. Accordingly, the cross-section area of the first cooling water inflow tube 2100 may be larger than the cross-sectional area of the second cooling water inflow tubes 3000 and the cross-sectional area of the first cooling water discharge tube 2200 may be larger than the cross-sectional area of the second cooling water discharge tubes 4000.

Meanwhile, the cooling water introduced through the second cooling water inflow tubes 3000 in the second direction may pass through the cooling water passage chamber 1100 of each unit module 1000 in the third direction and then be discharged through the second cooling water discharge tubes 4000 in the second direction. To this end, at least one cooling water inflow port 1110 and at least one cooling water discharge port 1120 may be formed in each cooling water passage chamber 1100. The cooling water inflow port 1110 of the cooling water passage chamber 1100 may be formed on a third surface that is one surface between the first surface 1101 and the second surface 1102 of the cooling water passage chamber 1100, and the cooling water discharge port 1120 of the cooling water passage chamber 1100 may be formed in a fourth surface 1104 that is the other surface between the first surface 1101 and the second surface 1102 of the cooling water passage chamber 1100. Here, the third surface 1103 may be a surface disposed in a downward direction from the third direction, and the fourth surface 1104 may be a surface disposed in an upward direction from the third direction. That is, the third surface 1103 may be a surface disposed close to the second cooling water inflow tubes 3000, and the fourth surface 1104 may be a surface disposed close to the second cooling water discharge tubes 4000.

Further, the cooling water inflow port 1110 of the cooling water passage chamber 1100 may be connected to the second cooling water inflow tubes 3000 and a cooling water discharge port (not illustrated) of the cooling water passage chamber 1100 may be connected to the second cooling water discharge tubes 4000. To this end, at least one cooling water discharge port 3100 may be formed in the second cooling water inflow tubes 3000, at least one cooling water inflow port (not illustrated) may be formed in the second cooling water discharge tubes 4000, the cooling water discharge port 3100 of the second cooling water inflow tubes 3000 may be connected to the cooling water inflow port 1110 of the cooling water passage chamber 1100, and the cooling water inflow port of the second cooling water discharge tubes 4000 may be connected to a cooling water discharge port of the cooling water passage chamber 1100. In this case, the cooling water discharge port and the cooling water inflow port may be formed at positions corresponding to each other and at least one of the cooling water discharge port and the cooling water inflow port may include a protrusion. Accordingly, the cooling water discharge port and the cooling water inflow port may be fitted with each other or may be fitted by a fitting member, and additionally, a region where the cooling water discharge port and the cooling water inflow port are connected to each other may be sealed by a sealing member.

Referring to FIGS. 1 to 3 and FIGS. 8 and 9, after the plurality of second cooling water inflow tubes 3000 are arranged in a lower end of the frame 2000, the plurality of unit modules 1000 are arranged on the plurality of second cooling water inflow tubes 3000, and the plurality of second cooling water discharge tubes 4000 are arranged in an upper end of the frame 2000 on the plurality of unit modules 1000.

As many holes 2110 as the number of the plurality of second cooling water inflow tubes 3000 may be formed in the first cooling water inflow tube 2100 formed at a lower end of the frame 2000 such that the cooling water may be distributed and introduced into the plurality of second cooling water inflow tubes 3000 from the first cooling water inflow tube 2100 of the frame 2000, and the second cooling water inflow tubes 3000 may be arranged according to the positions of the holes 2110. Likewise, as many holes 2210 as the number of the plurality of second cooling water discharge tubes 4000 may be formed in the first cooling water discharge tube 2200 formed in the upper end of the frame 2000 such that the cooling water may be collected and discharged to the first cooling water discharge tube 2200 of the frame 2000 from the plurality of second cooling water discharge tubes 4000, and the second cooling water discharge tubes 4000 may be arranged according to the positions of the holes 2210.

Meanwhile, the pair of second cooling water inflow tubes 3000 and the pair of second cooling water discharge tubes 4000 may be connected to the plurality of unit modules 1000 arranged in the second direction. For example, the second cooling water inflow tube 3000-1 may be connected to the first unit module 1000-1 and another unit module 1000-11 disposed adjacent to the first unit module 1000-1 in the second direction. Likewise, the second cooling water discharge tube 4000-1 may be connected to the first unit module 1000-1 and another unit module 1000-11 disposed adjacent to the first unit module 1000-1 in the second direction. To this end, the frame 2000 may further include a support wall 2300 disposed between the plurality of unit modules 1000 arranged in the second direction. That is, the support wall 2300 may be disposed between one unit module group including the plurality of unit modules 1000 arranged in the first direction and another unit module group disposed adjacent to the one unit module group in the second direction. In this case, first grooves 2310 in which the second cooling water inflow tubes 3000 are arranged and second grooves 2320 in which the second cooling water discharge tubes 4000 are arranged may be formed in the support wall 2300. The number of the first grooves 2310 and the number of the second grooves 2320 formed in one support wall 2300 may be equal to the number of the second cooling water inflow tubes 3000 and the number of the second cooling water discharge tubes 4000, respectively, that is, the number of the unit modules 1000 arranged in the one unit module group.

The second cooling water inflow tubes 3000 and the second cooling water discharge tubes 4000 may be fixed to the first grooves 2310 and the second grooves 2320, respectively. To this end, a fixing member 5000 may be assembled on the plurality of second cooling water discharge tubes 4000, and the fixing member 5000, the plurality of second cooling water discharge tubes 4000, and the support wall 23000 may be fastened to each other by screws. Although not illustrated, fixing members having the same structure may be assembled on the plurality of second cooling water inflow tubes 3000 sides.

According to such an assembling method, the number of the assembled unit modules may be easily adjusted according to the desired amount of power generation. Further, when some of the unit modules are damaged or malfunctioned, a process of disassembling the heat conversion device, replacing the unit module, and then reassembling the unit modules is easy. Further, since the unit module itself does not need to be fixed to the frame by screws, the assembling is easy. Further, since the second cooling water inflow tubes arranged below the unit modules may perform not only a function of cooling water inflow but also a function of supporting the unit modules, the heat conversion device has the rigidity, and thus may be prevented from being deformed during vibration or impact.

Referring to FIGS. 1 to 3, FIGS. 8 and 9, and FIGS. 10 and 11, the cooling water may be introduced through the first cooling water inflow tube 2100 in the first direction and distributed into the plurality of second cooling water inflow tubes 3000. Further, the cooling water may flow through the second cooling water inflow tubes 3000 in the second direction and be introduced into the cooling water passage chamber 1100. The cooling water introduced into the cooling water passage chamber 1100 may flow toward an upper end of the cooling water passage chamber 1100 in the third direction and be discharged to the second cooling water discharge tubes 4000. Further, the cooling water in the second cooling water discharge tubes 4000 may flow toward the first cooling water discharge tube 2200 in the second direction and the cooling water collected in the first cooling water discharge tube 2200 may be discharged to the outside.

In this case, the high-temperature gas flows from the upper end toward a lower end of the cooling water passage chamber 1100. When the second cooling water discharge tubes 4000 are arranged at an upper end of the unit module 1000 as in the embodiment of the present invention, a problem that the performance of the thermoelectric element is degraded due to the high temperature of the high-temperature gas may be prevented. Further, since the cooling water flows from the lower end toward the upper end of the cooling water passage chamber 1100, the cooling water may be filled from the bottom of the cooling water passage chamber 1100, and since a direction in which the high-temperature gas flows is opposite to a direction in which the cooling water flows, a uniform heat exchange temperature may be provided to all of the unit modules.

FIG. 12 is a top view of a heat conversion device according to another embodiment of the present invention, and FIG. 13 is a perspective view of the heat conversion device of FIG. 12. Here, although it is illustrated that only a portion of the frame 2000 may be filled with the unit modules, the present invention is not limited thereto, and the entirety or a portion of the frame 2000 may be filled with the unit modules. Duplicated description for the same contents illustrated in FIGS. 1 to 11 will be omitted.

Referring to FIGS. 12 and 13, the cross-sectional areas of the first cooling water inflow tube 2100 and the first cooling water discharge tube 2200 of the frame 2000 may decrease as the first cooling water inflow tube 2100 and the first cooling water discharge tube 2200 become further away from an inlet of the first cooling water inflow tube 2100. Accordingly, high hydraulic pressure may be applied even to the second cooling water inflow tubes 4000 arranged at a large distance from the inlet of the first cooling water inflow tube 2100, and thus the cooling water may be uniformly introduced into the plurality of second cooling water inflow tubes 4000.

FIG. 14 is a perspective view of a heat conversion device according to yet another embodiment of the present invention. Here, although it is illustrated that only a portion of the frame 2000 may be filled with the unit modules, the present invention is not limited thereto, and the entirety or a portion of the frame 2000 may be filled with the unit modules. Duplicated description for the same contents illustrated in FIGS. 1 to 11 will be omitted.

Referring to FIG. 14, the inlet of the first cooling water inflow tube 2100 of the frame 2000 may be formed in a side surface of the first cooling water inflow tube 2100. Accordingly, since the cooling water introduced into the inlet of the first cooling water inflow tube 2100 may be introduced in the second direction, the cooling water may be uniformly introduced into the plurality of second cooling water inflow tubes 4000.

According to still another embodiment of the present invention, heat radiation fins may be arranged on the inner wall of each cooling water passage chamber 1100. The shape and the number of the heat radiation fins, the area where the heat radiation fins occupy the inner wall of the cooling water passage chamber 1100, and the like may be variously changed depending on the temperature of the cooling water, the temperature of waste heat, the required power generation capacity, and the like. The area where the heat radiation fins occupy the inner wall of the cooling water passage chamber 1100 may be, for example, 1% to 40% of the cross-sectional area of the cooling water passage chamber 1100. Accordingly, high thermoelectric conversion efficiency may be obtained without disturbing the flow of the cooling water.

Further, the inside of the cooling water passage chamber 1100 may be partitioned into a plurality of regions. When the inside of the cooling water passage chamber 1100 is partitioned into the plurality of regions, since the cooling water may be uniformly distributed inside the cooling water passage chamber 1100 even when the flow rate of the cooling water is not sufficient to fully fill the inside of the cooling water passage chamber 1100, uniform thermoelectric conversion efficiency for the entire surface of the cooling water passage chamber 1100 may be obtained.

FIG. 15 is a perspective view of a heat conversion device according to yet another embodiment of the present invention, FIG. 16 is a partially enlarged view of the heat conversion device according to the embodiment of FIG. 15, FIG. 17 is a perspective view of a unit module included in the heat conversion device according to the embodiment of FIG. 15, FIG. 18 is an exploded view of the unit module of FIG. 17, and FIG. 19 is a sectional view of the heat conversion device according to another embodiment of FIG. 15.

Referring to FIGS. 15 to 19, a heat conversion device 20 includes a plurality of unit module groups and a frame 7000 supporting the plurality of unit module groups. Here, each unit module group includes a plurality of unit modules 6000.

Here, the plurality of unit modules 6000 may be arranged in a first direction and a second direction, and the second direction is a direction intersecting the first direction, for example, a direction perpendicular to the first direction. In the present specification, the plurality of unit modules 6000 arranged in the first direction may be described as forming one unit module group, and accordingly, the plurality of unit module groups may be arranged in the second direction. Here, the plurality of unit modules 6000 included in the one unit module group may be arranged to be spaced apart from each other by a predetermined interval. In the present specification, for convenience of description, the heat conversion device 20 is described as an example of including five unit module groups arranged in the second direction, that is, a first unit module group 6000-A, a second unit module group 6000-B, a third unit module group 6000-C, a fourth unit module group 6000-D, and a fifth unit module group 6000-E. However, the present invention is not limited thereto.

The frame 7000 may be a frame or edge disposed to surround the outer periphery of the plurality of unit modules 6000. In this case, the frame 7000 may include a cooling water inflow tube (not illustrated) for injecting cooling water into the plurality of unit modules 6000 and a cooling water discharge tube (not illustrated) for discharging the cooling water passing through the insides of the plurality of unit modules 6000. One of the cooling water inflow tube and the cooling water discharge tube may be formed at an edge disposed on the side surface of a unit module group disposed at one border among the plurality of unit module groups, for example, the first unit module group 6000-A, and the other one may be formed at an edge disposed on the side surface of a unit module group disposed at another border among the plurality of unit module groups, for example, the fifth unit module group 6000-E.

In particular, referring to FIGS. 17 and 18, each unit module 6000 includes a cooling water passage chamber 6100, a first thermoelectric module 6200 disposed in one surface 6101 of the cooling water passage chamber 6100, and a second thermoelectric module 6300 disposed in the other surface 6102 of the cooling water passage chamber 6100. Here, the one surface 6101 and the other surface 6102 of the cooling water passage chamber 6100 may be both surfaces arranged to be spaced apart from each other in the first direction by a predetermined interval, and in the present specification, the one surface 6101 and the other surface 6102 of the cooling water passage chamber 6100 are interchangeable with a first surface and a second surface of the cooling water passage chamber 6100.

A low temperature part, that is, a heat radiation part, of the first thermoelectric module 6200 may be disposed on the outer surface of the first surface 6101 of the cooling water passage chamber 6100, and a high temperature part, that is, a heat absorption part, of the first thermoelectric module 6200 may be disposed to face the second thermoelectric module 6300 of another adjacent unit module 6000. Likewise, a low temperature part, that is, a heat radiation part, of the second thermoelectric module 6300 may be disposed on the outer surface of the second surface 6102 of the cooling water passage chamber 6100, and a high temperature part, that is, a heat absorption part, of the second thermoelectric module 6300 may be disposed to face the first thermoelectric module 6200 of another adjacent unit thermoelectric module 6000.

The heat conversion device 20 according to the embodiment of the present invention may generate electric power by using a temperature difference between the cooling water flowing through the cooling water passage chamber 6100 and high-temperature gas passing through a separation space between the plurality of unit modules 6000, that is, a temperature difference between the heat absorption part and the heat radiation part of the first thermoelectric module 6200 and a temperature difference between the heat absorption part and the heat radiation part of the second thermoelectric module 6300. Here, the cooling water may be water but is not limited thereto and may be various types of fluids having cooling performance. The temperature of the cooling water flowing into the cooling water passage chamber 6100 may be less than 100° C., preferably less than 50° C., and more preferably less than 40° C., but is not limited thereto. The temperature of the cooling water discharged after passing through the cooling water passage chamber 6100 may be higher than the temperature of the cooling water introduced into the cooling water passage chamber 6100. The temperature of the high-temperature gas passing through the separation space between the plurality of unit modules 6000 may be higher than the temperature of the cooling water. For example, the temperature of the high-temperature gas passing through the separation space between the plurality of unit modules 6000 may be 100° C. or more, preferably 150° C. or more, and more preferably 200° C. or more, but is not limited thereto. In this case, the width of the separation space between the plurality of unit modules 6000 may be several millimeters to several tens of millimeters and may vary depending on the size of the heat conversion device, the temperature of introduced gas, the inflow rate of the gas, the required amount of power generation, and the like.

The first thermoelectric module 6200 and the second thermoelectric module 6300 may each include a plurality of thermoelectric elements 100. The number of thermoelectric elements included in each thermoelectric module may be adjusted depending on the required amount of power generation.

The plurality of thermoelectric elements 100 included in each thermoelectric module may be electrically connected to each other, and at least some of the plurality of thermoelectric elements 100 may be electrically connected to each other using a bus bar (not illustrated). For example, the bus bar may be disposed on a side of a discharge port through which the high-temperature gas is discharged after passing through the separation space between the plurality of unit modules 6000 and may be connected to an external terminal. Accordingly, even while a PCB for the first thermoelectric module 6200 and the second thermoelectric module 6300 is not disposed inside the heat conversion device, power may be supplied to the first thermoelectric module 6200 and the second thermoelectric module 6300, and accordingly, the design and assembly of the heat conversion device 10 is easy. Each unit module 6000 may further include a heat insulation layer 6400 and a shield layer 6500 arranged between the plurality of thermoelectric elements 100. The heat insulation layer 6400 may be disposed to surround at least a portion of the outer surface of the cooling water passage chamber 6100 except for a region in which the thermoelectric element 100 is disposed among the outer surface of the cooling water passage chamber 6100. In particular, when the heat insulation layer 6400 is disposed between the thermoelectric elements 100 on the first surface 6101 and the second surface 6102 on which the plurality of thermoelectric elements 100 are arranged among the outer surface of the cooling water passage chamber 6100, heat insulation between a low-temperature portion and a high-temperature portion may be maintained due to the heat insulation layer 6400, thereby increasing power generation efficiency.

Further, the shield layer 6500 may be disposed on the heat insulation layer 6400 and protect the heat insulation layer 6400 and the plurality of thermoelectric elements 100. To this end, the shield layer 6500 may include a stainless material.

The shield layer 6500 and the cooling water passage chamber 6100 may be fastened to each other by screws. Accordingly, the shield layer 6500 may be stably coupled to the unit module 6000 and the first thermoelectric module 6200 or the second thermoelectric module 6300 and the heat insulation layer 6400 may be fixed together.

In this case, each of the first thermoelectric module 6200 and the second thermoelectric module 6300 may adhere to the first surface 6101 and the second surface 6102 of the cooling water passage chamber 6100 using a thermal pad 6600. Since the thermal pad 6600 facilities heat transfer, the heat transfer between the cooling water passage chamber 6100 and the thermoelectric module may not be disturbed. Further, each of the first thermoelectric module 6200 and the second thermoelectric module 6300 may further include a heat sink disposed on the high-temperature portion side of the thermoelectric element 100 and a metal plate 300, for example, an aluminum plate, disposed on the low-temperature portion side of the thermoelectric element 100. In this case, the heat sink 200 is disposed toward another adjacent unit module. The heat sink 200 included in the first thermoelectric module 6200 may be disposed toward the second thermoelectric module 6300 of another adjacent unit module 6000-1 (see FIG. 16) and the heat sink 200 included in the second thermoelectric module 6300 may be disposed toward the first thermoelectric module 6200 of still another adjacent unit module 6000-2 (see FIG. 16). In this case, the heat sinks 200 of different adjacent unit modules 6000 may be spaced apart from each other by a predetermined interval. Accordingly, the temperature of air passing between the plurality of unit modules 6000 may be efficiently transferred to the high-temperature portion side of the thermoelectric element 100 through the heat sinks 200. Meanwhile, since the metal plate 300, for example, the aluminum plate, has high heat transfer efficiency, the temperature of the cooling water passing through the cooling water passage chamber 6100 may be efficiently transferred to the low-temperature portion side of the thermoelectric element 100 through the metal plate 300. As illustrated, although a plurality of thermoelectric elements 100 may be arranged in one metal plate 300, the present invention is not limited thereto, and one thermoelectric element 100 may be disposed in one metal plate 300. Detailed description of the thermoelectric element 100 is the same as that of FIGS. 6 and 7, the duplicated description will be omitted.

According to the embodiment of the present invention, the unit module 6000 may further include a first support frame 6700 disposed on a third surface 6103 side between the first surface 6101 and the second surface 6102 of the cooling water passage chamber 6100 and a second support frame 6800 disposed on a fourth surface 6104 side between the first surface 6101 and the second surface 6102 of the cooling water passage chamber 6100. Here, the third surface 6103 may be a surface facing downward in the third direction and the fourth surface 6104 may be a surface facing upward in the third direction. The shape of at least one of the first support frame 6700 and the second support frame 6800 may be an H shape, for example, an H beam. The number of the first support frames 6700 and the second support frames 6800 included in the heat conversion device 20 may be the same as the total number of the unit modules 6000 included in the heat conversion device 20. As illustrated in FIGS. 17 and 18, the first support frame 6700 and the second support frame 6800 arranged on the same unit module side may be referred to as a pair of support frames. When the first support frame 6700 and the second support frame 6800 are arranged on the third surface 6103 side and the fourth surface 6104 side of the cooling water passage chamber 6100, respectively, the rigidity of the unit module may be maintained and bending or deformation during vibration may be prevented.

To this end, the frame 7000 may further include a support wall 7300 disposed between the first unit module group 6000-A and the second unit module group 6000-B and each of the first support frame 6700 and the second support frame 6800 may be fastened to the support wall 7300. In this case, the support wall 7300 may be fastened to a frame or edge of the frame 7000 or formed integrally.

In more detail, the support wall 7300 may be disposed between the first unit module group 6000-A and the second unit module group 6000-B, the first support frame 6700 and the second support frame 6800 arranged in the unit module 6000 of the first unit module group 6000-A may extend from lower and upper portions of the support wall 7300 toward a direction in which the second unit module group 6000-B is disposed, and the first support frame 6700 and the second support frame 6800 arranged in the unit module 6000 of the second unit module group 6000-B may extend from lower and upper portions of the support wall 7300 toward a direction in which the first unit module group 6000-A is disposed. In this case, the extension length of each of the first support frame 6700 and the second support frame 6800 may not exceed a half of the thickness of the support wall 7300. Further, a lower portion of the first support frame 6700 and the support wall 7300 and an upper portion of the second support frame 6800 and the support wall 7300 may be fastened to each other by screws. Accordingly, since the unit module itself does not need to be directly fixed to the frame by screws, the assembling is easy. Further, it is easy to adjust the number of the unit modules according to the desired amount of power generation.

Here, although it is illustrated that the pair of support frames support one single module, the present invention is not limited thereto. The first support frame 6700 and the second support frame 6800 may extend in the second direction to simultaneously support one of a plurality of unit modules included in one unit module group and one of a plurality of unit modules included in another adjacent unit module group. Accordingly, the numbers of the first support frames 6700 and the second support frames 6800 included in the heat conversion device 20 may be the same as the number of the unit modules 6000 included in the first unit module group 6000-A or a multiple of the number of the unit modules 6000 included in the first unit module group 6000-A.

To this end, a plurality of grooves in which the first support frame 6700 is disposed may be formed in a lower end of the support wall 7300, a plurality of grooves in which the second support frame 6800 is disposed may be formed in an upper end of the support wall 7300, and each of the first support frame 6700 and the second support frame 6800 may be fastened to the support wall 7300 by fixing members such as screws. The number of the grooves formed in the lower and upper ends of one support wall 7300 may be the same as the number of the unit modules 6000 arranged in one unit module group.

According to the embodiment of the present invention, a cooling water inflow port is formed on one side surface of the cooling water passage chamber 6100 and a cooling water discharge port is formed on the other side surface thereof.

A cooling water inflow port 6110 may be formed in a fifth surface 6105 that is one of both surfaces between the first surface 6101, the second surface 6102, the third surface 6103, and the fourth surface 6104 and a cooling water discharge port 6120 may be formed in a sixth surface 6106 that is the other one of both of the surfaces between the first surface 6101, the second surface 6102, the third surface 6103, and the fourth surface 6104. In FIG. 15, when the first unit module group 6000-A, the second unit module group 6000-B, the third unit module group 6000-C, the fourth unit module group 6000-D, and the fifth unit module group 6000-E may be sequentially arranged in the second direction, and the cooling water flows in a direction from the first unit module group 6000-A toward the fifth unit module group 6000-E, the cooling water inflow port 6110 may be formed in one side surface, that is, the fifth surface 6105 that is an outer side surface, of each cooling water passage chamber 6100 of each unit module 6000 included in the first unit module group 6000-A, and the cooling water discharge port 6120 may be formed in the other side surface, that is, the sixth surface 6106 that is a side surface disposed to face the second unit module group 6000-B, of each cooling water passage chamber 6100 of each unit module 6000 included in the first unit module group 6000-A. Likewise, the cooling water inflow port 6110 may be formed on one side surface, that is, the fifth surface 6105 that is a side surface disposed to face the first unit module group 6000-A, of each cooling water passage chamber 6100 of each unit module 6000 included in the second unit module group 6000-B, and the cooling water discharge port 6120 may be formed on the other side surface, that is, the sixth surface 6106 that is a side surface disposed to face the third unit module group 6000-C, of each cooling water passage chamber 6100 of each unit module 6000 included in the second unit module group 6000-B.

In this case, in order for the cooling water to flow in a direction from the first unit module group 6000-A to the fifth unit module group 6000-E, a hole 7310 may be formed in the support wall 7300 disposed between both unit module groups to correspond to the positions of the cooling water inflow port 6110 and the cooling water discharge port 6120. For example, the hole 7310 may be formed to simultaneously correspond to the position of the cooling water discharge port 6120 formed in each cooling water passage chamber 6100 of each unit module 6000 included in the first unit module group 6000-A and the position of the cooling water inflow port 6110 formed in each cooling water passage chamber 6100 of each unit module 6000 included in the second unit module group 6000-B. Accordingly, the cooling water discharge port 6120 formed in each cooling water passage chamber 6100 of each unit module 6000 included in the first unit module group 6000-A may be connected, through the hole 7310, to the cooling water inflow port 6110 formed in each cooling water passage chamber 6100 of each unit module 6000 included in the second unit module group 6000-B, and the cooling water may flow from each cooling water passage chamber 6100 of each unit module 6000 included in the first unit module group 6000-A to each cooling water passage chamber 6100 of each unit module 6000 included in the second unit module group 6000-B. This structure may be equally applied to the second unit module group 6000-B, the third unit module group 6000-C, the fourth unit module group 6000-D, and the fifth unit module group 6000-E.

According to the embodiment of the present invention, as illustrated in FIG. 19, a first fitting member 6112 may be connected to each cooling water inflow port 6110 and a second fitting member 6122 may be connected to each cooling water discharge port 6120. In this case, the first fitting member 6112 and the second fitting member 6122 may be fitted with the cooling water inflow port 6110 and the cooling water discharge port 6120, respectively, and may have a hollow tubular shape such that the cooling water may pass therethrough. Further, the first fitting member 6112 and the second fitting member 6122 may be simultaneously fitted with one hole 7310. For example, the second fitting member 6122 connected to the cooling water discharge port 6120 formed in each cooling water passage chamber 6100 of each unit module 6000 included in the first unit module group 6000-A and the first fitting member 6112 connected to the cooling water inflow port 6110 formed in each cooling water passage chamber 6100 of each unit module 6000 included in the second unit module group 6000-B may be fitted together in one of a plurality of the holes 7310 formed in the support wall 7300 disposed between the first unit module group 6000-A and the second unit module group 6000-B. In this case, in order to prevent a problem that the cooling water leaks between the second fitting member 6122 and the first fitting member 6112, the outer circumferential surface of the first fitting member 6112, the outer circumferential surface of the second fitting member 6122, and the inner circumferential surface of the hole 7310 may be sealed together.

According to the embodiment of the present invention, a plurality of the cooling water inflow ports 6110 and a plurality of the cooling water discharge ports 6120 are formed in the fifth surface 6105 and the sixth surface 6106 of each cooling water passage chamber 6100, and the plurality of holes 7310 may be formed in the support wall 7300 to correspond to the positions of the plurality of cooling water inflow ports 6110 and the positions of the plurality of cooling water discharge ports 6120.

In this case, in order for the cooling water to flow smoothly, a plurality of cooling water passage tubes 6130 may be formed inside the cooling water passage chamber 6100. The cooling water passage tube 6130 may be connected from the cooling water inflow port 6110 to the cooling water discharge port 6120 inside the cooling water passage chamber 6100, and the cooling water may flow in the second direction through the cooling water passage tube 6130. Accordingly, since the cooling water may be uniformly distributed inside the cooling water passage chamber 6100 even when the flow rate of the cooling water is not sufficient to fully fill the inside of the cooling water passage chamber 6100, uniform thermoelectric conversion efficiency for the entire surface of the cooling water passage chamber 6100 may be obtained.

In this way, after flowing into the first unit group module 6000-A, the cooling water may be discharged to the fifth unit group module 6000-E via the second unit group module 6000-B, the third unit group module 6000-C, and the fourth unit group module 6000-D in the second direction.

Further, the high-temperature gas flows from the upper end toward the lower end of the cooling water passage chamber 6100. When the second support frame 6800 is disposed at an upper end of the unit module 6000 as in the embodiment of the present invention, a problem that the performance of the thermoelectric element is degraded due to the high temperature of the high-temperature gas may be prevented.

Although not illustrated, according to the embodiment of the present invention, a cooling water inflow tube may be formed on one side surface of the first unit module group 6000-A, for example, in a frame or edge of the frame 7000 facing the fifth surface, and a cooling water discharge tube may be formed on the other side surface of the fifth unit module group 6000-E, for example, in a frame or edge of the frame 7000 facing the sixth surface. The cooling water introduced into the cooling water inflow tube may be distributed and introduced into the cooling water inflow ports 6110 of the cooling water passage chambers 6100 of the plurality of unit modules 6000 included in the first unit module group 6000-A. Further, the cooling water discharged from the cooling water discharge ports 6120 of the cooling water passage chambers 6100 of the plurality of unit modules 6000 included in the fifth unit module group 6000-E may be collected in the cooling water discharge tube and discharged to the outside.

According to still another embodiment of the present invention, heat radiation fins may be arranged on the inner wall of each cooling water passage chamber 6100 or on the inner wall of the cooling water passage tube 6130. The shape and the number of the heat radiation fins, the area where the heat radiation fins occupy the inner wall of the cooling water passage chamber 6100, and the like may be variously changed depending on the temperature of the cooling water, the temperature of waste heat, the required power generation capacity, and the like. The area where the heat radiation fins occupy the inner wall of the cooling water passage chamber 6100 may be, for example, 1% to 40% of the cross-sectional area of the cooling water passage chamber 6100. Accordingly, high thermoelectric conversion efficiency may be obtained without disturbing the flow of the cooling water.

Although the exemplary embodiments of the present invention have been described above, those skilled in the art may understand that the present invention may be variously modified and changed without departing from the spirit and scope of the present invention described in the appended claims.

The invention claimed is:

1. A heat conversion device comprising:
a plurality of unit modules arranged in each of a first direction and a second direction intersecting the first direction;
a frame configured to support the plurality of unit modules and including a first cooling water inflow tube and a first cooling water discharge tube formed in the first direction, wherein the first cooling water discharge tube is disposed on, in a third direction, the first cooling water inflow tube, the third direction being transverse to the first direction and transverse to the second direction;
a plurality of second cooling water inflow tubes connected to the first cooling water inflow tube and arranged, in the first direction, on first sides of the plurality of unit modules, wherein each of the plurality of second cooling water inflow tubes extends in the second direction; and
a plurality of second cooling water discharge tubes connected to the first cooling water discharge tube and arranged, in the first direction, on second sides of the plurality of unit modules, wherein each of the plurality of second cooling water discharge tubes extends in the second direction, the second sides of the plurality of unit modules is opposite to the first sides of the plurality of unit modules,
wherein each unit module includes:
a cooling water passage chamber including a cooling water inflow port and a cooling water discharge port;
a first thermoelectric module disposed on a first surface of the cooling water passage chamber; and
a second thermoelectric module disposed on a second surface of the cooling water passage chamber, the second surface of the cooling water passage chamber is facing in an opposite direction as the first surface of the cooling water passage chamber,
wherein the cooling water inflow port of the cooling water passage chamber is disposed in a third surface of the cooling water passage chamber between the first and second surfaces of the cooling water passage chamber and the cooling water discharge port of the cooling water passage chamber is disposed in a fourth surface of the cooling water passage chamber between the first and second surfaces of the cooling water passage chamber, and
wherein the cooling water inflow port of the third surface of the cooling water passage chamber is connected to the plurality of second cooling water inflow tubes, and the cooling water discharge port of the fourth surface of the cooling water passage chamber is connected to the plurality of second cooling water discharge tubes.

2. The heat conversion device of claim 1, wherein the plurality of unit modules arranged in the first direction are spaced apart from each other by a predetermined interval.

3. The heat conversion device of claim 2, wherein:
gas passes through a separation space between the unit modules spaced apart from each other by the predetermined interval; and
a temperature of the gas is higher than a temperature of cooling water of the cooling water passage chamber.

4. The heat conversion device of claim 3, wherein:
the gas passes in a direction from the plurality of second cooling water discharge tubes to the plurality of second cooling water inflow tubes; and
the cooling water in the cooling water passage chamber flows in a direction from the plurality of second cooling water inflow tubes to the plurality of second cooling water discharge tubes.

5. The heat conversion device of claim 1, wherein:
a cross-sectional area of the first cooling water inflow tube is larger than a cross-sectional area of the plurality of second cooling water inflow tubes; and
a cross-sectional area of the first cooling water discharge tube is larger than a cross-sectional area of the plurality of second cooling water discharge tubes.

6. The heat conversion device of claim 1, wherein a pair from among the plurality of second cooling water inflow tubes and the plurality of second cooling water discharge tubes are connected to the plurality of unit modules arranged in the second direction.

7. The heat conversion device of claim 6, wherein the frame further includes a support wall disposed between the plurality of unit modules arranged in the second direction.

8. The heat conversion device of claim 7, wherein:
first grooves and second grooves are formed at both ends of the support wall;
the plurality of second cooling water inflow tubes are fixed to the first grooves; and
the plurality of second cooling water discharge tubes are fixed to the second grooves.

9. The heat conversion device of claim 1, wherein cooling water introduced into the first cooling water inflow tube passes through the cooling water passage chamber via the plurality of second cooling water inflow tubes and is then discharged to the first cooling water discharge tube via the plurality of second cooling water discharge tubes.

10. The heat conversion device of claim 1, wherein each of the first thermoelectric module and the second thermoelectric module includes a plurality of thermoelectric elements, the plurality of thermoelectric elements are electrically connected to each other.

11. The heat conversion device of claim 10, wherein each of the unit modules further includes a heat insulation layer arranged between the plurality of thermoelectric elements.

12. The heat conversion device of claim 5, wherein the cooling water introduced into the first cooling water inflow tube in the first direction is distributed and introduced into the plurality of second cooling water inflow tubes, and the cooling water discharged from the plurality of second cooling water discharge tubes is collected by the first cooling water discharge tube and then discharged in the first direction.

13. The heat conversion device of claim 8, further comprising a fixing member arranged on the plurality of second cooling water discharge tubes,
wherein the fixing member, the plurality of second cooling water discharge tubes and the support wall are assembled by a connecting member.

14. The heat conversion device of claim 10, wherein the plurality of thermoelectric elements are electrically connected to each other by a bus bar.

15. The heat conversion device of claim 11, wherein the heat insulation layer is disposed to surround at least a portion of an outer surface of the cooling water passage chamber except for a region in which the plurality of thermoelectric elements is disposed among the outer surface of the cooling water passage chamber.

16. The heat conversion device of claim 11, wherein each of the unit modules further includes a shield layer arranged on the heat insulation layer.

17. The heat conversion device of claim 12, wherein holes corresponding to each of the plurality of second cooling water inflow tubes are formed in the first cooling water inflow tube, and each of the plurality of second cooling water inflow tubes is arranged according to a position of each of the holes.

18. The heat conversion device of claim 1, wherein a pair from among the plurality of second cooling water inflow tubes and the plurality of second cooling water discharge tubes is arranged in each of the unit modules.

* * * * *